US009058996B2

(12) United States Patent
Maeda et al.

(10) Patent No.: US 9,058,996 B2
(45) Date of Patent: Jun. 16, 2015

(54) METHOD FOR GENERATING MASK DATA AND METHOD FOR MANUFACTURING INTEGRATED CIRCUIT DEVICE

(71) Applicant: KABUSHIKI KAISHA TOSHIBA, Tokyo (JP)

(72) Inventors: Shimon Maeda, Tokyo (JP); Shinichi Ito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 167 days.

(21) Appl. No.: 13/771,928

(22) Filed: Feb. 20, 2013

(65) Prior Publication Data
US 2014/0094031 A1 Apr. 3, 2014

(30) Foreign Application Priority Data
Sep. 28, 2012 (JP) .................................. 2012-218043

(51) Int. Cl.
G06F 17/50 (2006.01)
H01L 21/027 (2006.01)
G03F 1/36 (2012.01)
G03F 1/00 (2012.01)

(52) U.S. Cl.
CPC .......... *H01L 21/027* (2013.01); *G06F 17/5068* (2013.01); *G03F 1/36* (2013.01); *G03F 1/144* (2013.01)

(58) Field of Classification Search
CPC ......... G03F 1/36; G03F 1/144; H01L 21/027; G06F 17/5068
USPC ..................................................... 716/50, 55
See application file for complete search history.

(56) References Cited

U.S. PATENT DOCUMENTS

| | | | | |
|---|---|---|---|---|
| 8,336,003 | B2 * | 12/2012 | Cheng et al. ..................... | 716/53 |
| 8,592,940 | B2 * | 11/2013 | Sandhu et al. ................ | 257/506 |
| 8,656,322 | B1 * | 2/2014 | Dechene et al. ................ | 716/55 |
| 8,667,428 | B1 * | 3/2014 | Latypov .......................... | 716/51 |
| 8,667,430 | B1 * | 3/2014 | Latypov .......................... | 716/51 |
| 8,673,771 | B2 * | 3/2014 | Kawamura .................... | 438/637 |
| 8,826,194 | B2 * | 9/2014 | Azuma ........................... | 716/55 |
| 8,856,693 | B2 * | 10/2014 | Cheng et al. .................... | 716/52 |

(Continued)

FOREIGN PATENT DOCUMENTS

JP 2010-512032 4/2010

OTHER PUBLICATIONS

Tsai, HsinYu et al., "Directed self assembly for even smaller printed circuits", Apr. 5, 2013. SPIE. pp. 1-4.*

(Continued)

*Primary Examiner* — Stacy Whitmore
(74) *Attorney, Agent, or Firm* — Finnegan, Henderson, Farabow, Garrett & Dunner, L.L.P.

(57) ABSTRACT

According to one embodiment, a method for generating mask data is configured to form a circuit pattern on a substrate using a directed self-assembly material. The method includes extracting a first region, setting a second region and setting a third region. The first region does not existing in the circuit pattern and existing in an initial pattern. The initial pattern includes a plurality of interconnect patterns extending in a first direction. The second region is formed by elongating the first region in a second direction intersecting the first direction. The second region straddles the first region in the second direction. The third region includes at least one of the second regions. The directed self-assembly material is disposed in the third region.

12 Claims, 43 Drawing Sheets

(56) References Cited

U.S. PATENT DOCUMENTS

| | | |
|---|---|---|
| 2005/0106839 A1* | 5/2005 | Shimoda et al. .............. 438/458 |
| 2008/0132070 A1 | 6/2008 | Li et al. |
| 2009/0206489 A1 | 8/2009 | Li et al. |
| 2011/0209106 A1* | 8/2011 | Cheng et al. .................... 716/55 |
| 2012/0220136 A1* | 8/2012 | Azuma ......................... 438/758 |
| 2012/0331428 A1* | 12/2012 | Cheng et al. .................... 716/52 |
| 2013/0224635 A1* | 8/2013 | Takekawa et al. ................ 430/5 |
| 2013/0230981 A1* | 9/2013 | Kawamura .................... 438/637 |
| 2014/0187054 A1* | 7/2014 | Park et al. ...................... 438/781 |

OTHER PUBLICATIONS

Notification of Reason(s) for Refusal issued by the Japanese Patent Office on Feb. 27, 2015; for Japanese Patent Application No. 2012-218043, and English-language translation thereof.

* cited by examiner

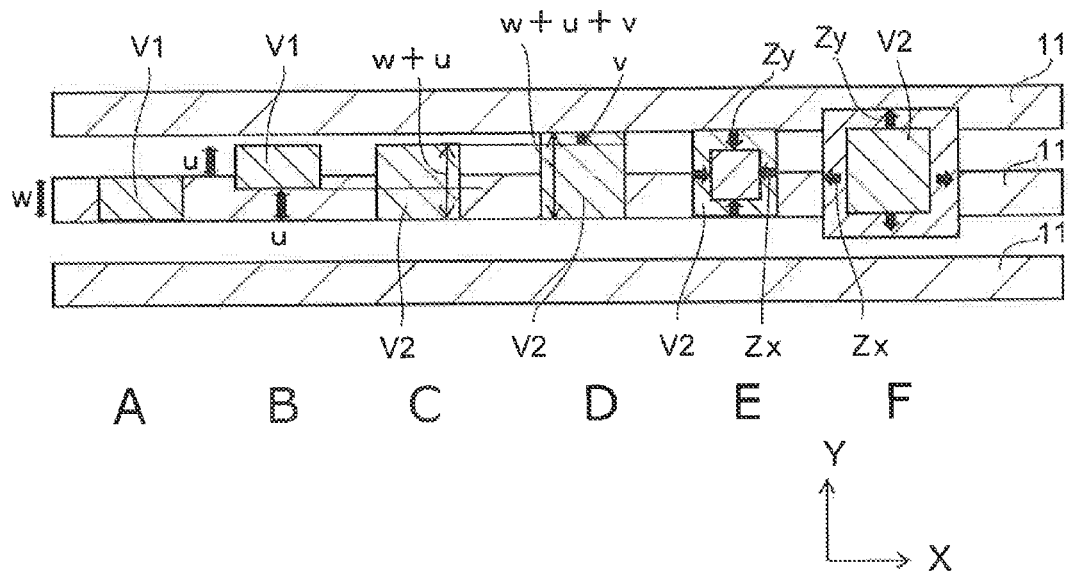

FIG. 6 w: WIDTH OF INTERCONNECT PATTERN 11
u: MAXIMUM VALUE OF ASSUMED ALIGNMENT SHIFT
v: ADDITIONAL EXTENSION AMOUNT WITHOUT CONTACTING ADJACENT INTERCONNECT PATTERN 11
Zx: X-DIRECTION PATTERNING CONVERSION DIFFERENCE AMOUNT
Zy: Y-DIRECTION PATTERNING CONVERSION DIFFERENCE AMOUNT

Y-DIRECTION ELONGATED AMOUNT: NOT LESS THAN $u + 2Zy$ AND NOT MORE THAN $u + 2Zy + v$
X-DIRECTION ELONGATED AMOUNT: $2Zx$

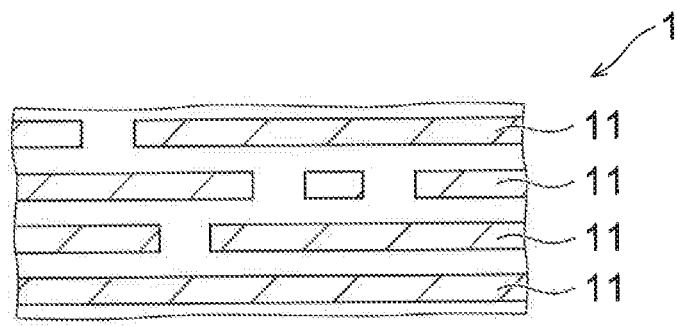
FIG. 9A
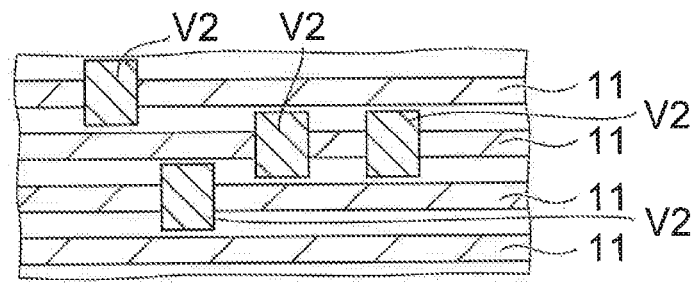
FIG. 9B
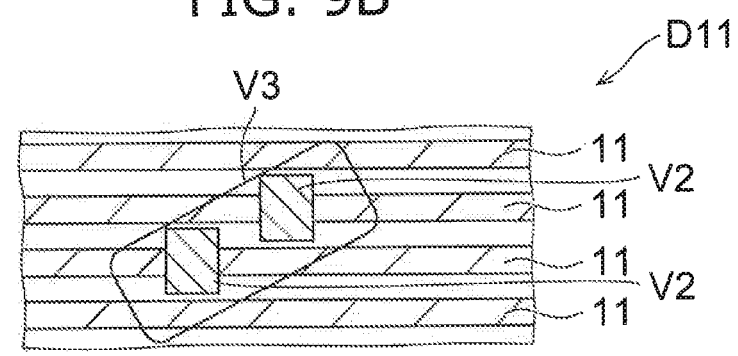
FIG. 9C
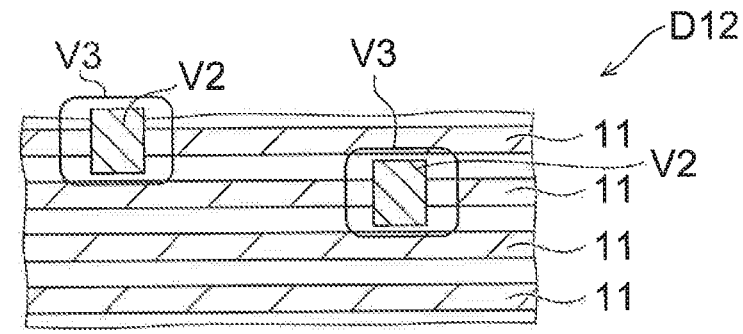
FIG. 9D
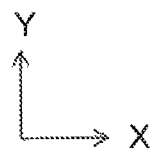

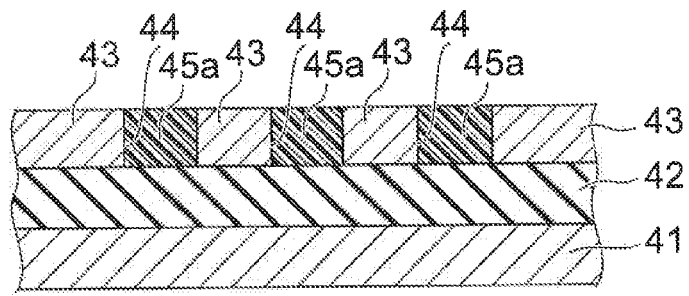
FIG. 12A
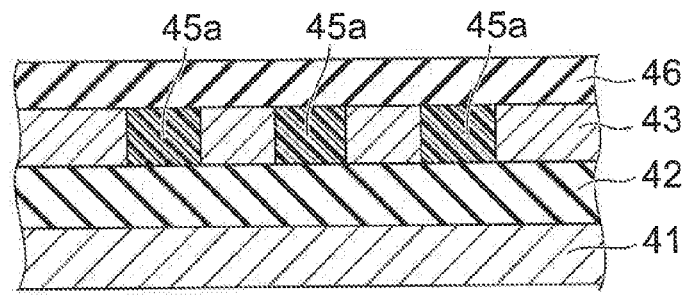
FIG. 12B
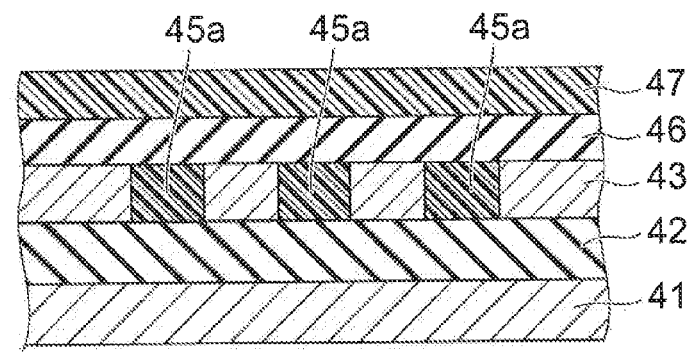
FIG. 12C
FIG. 12D
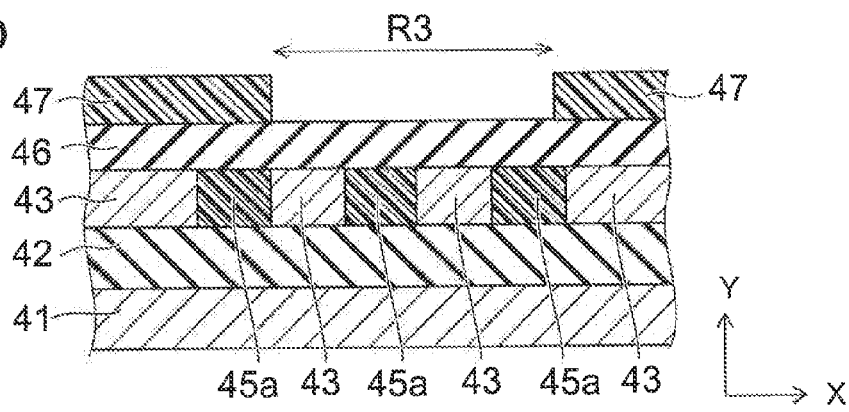

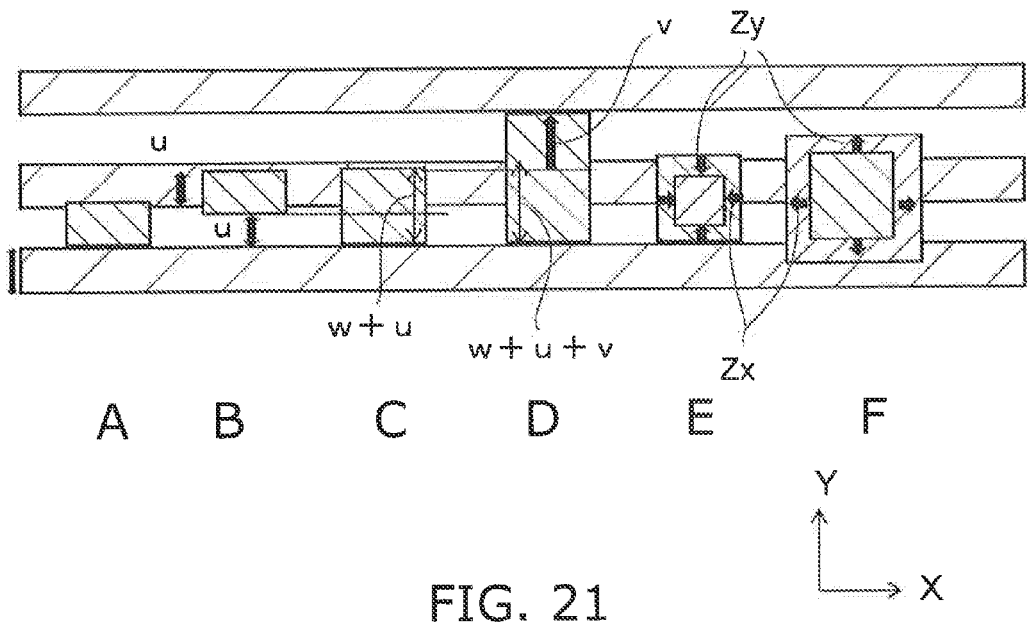

FIG. 21 w: WIDTH OF INTERCONNECT PATTERN 11
u: MAXIMUM VALUE OF ASSUMED ALIGNMENT SHIFT
v: ADDITIONAL EXTENSION AMOUNT WITHOUT CONTACTING ADJACENT INTERCONNECT PATTERN 11
Zx: X-DIRECTION PATTERNING CONVERSION DIFFERENCE AMOUNT
Zy: Y-DIRECTION PATTERNING CONVERSION DIFFERENCE AMOUNT

Y-DIRECTION ELONGATED AMOUNT: NOT LESS THAN $u + 2Zy$ AND NOT MORE THAN $u + 2Zy + v$
X-DIRECTION ELONGATED AMOUNT: $2Zx$

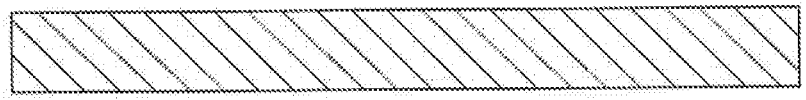
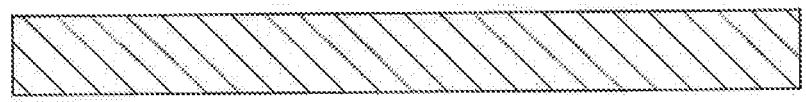
FIG. 32A
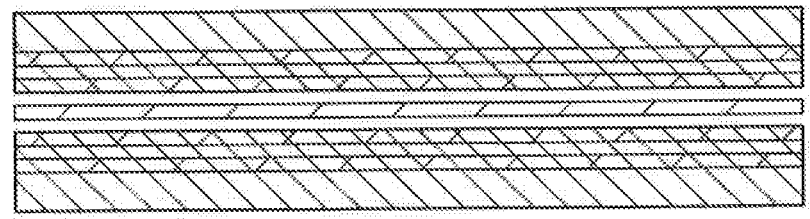
FIG. 32B
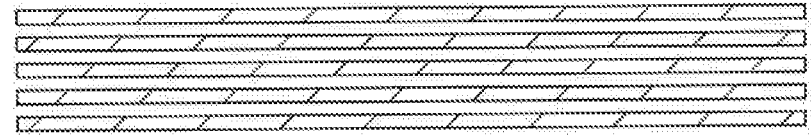
FIG. 32C
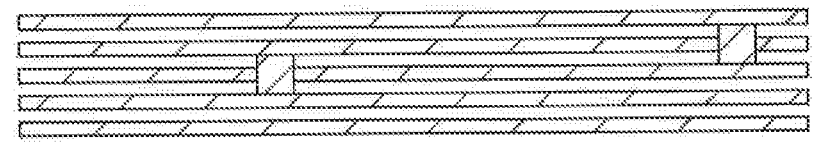
FIG. 32D
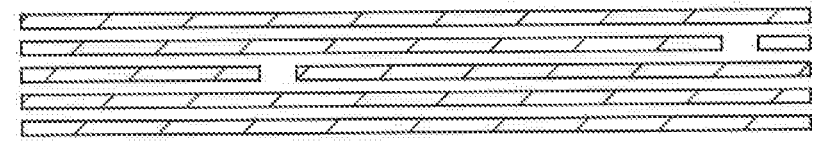
FIG. 32E

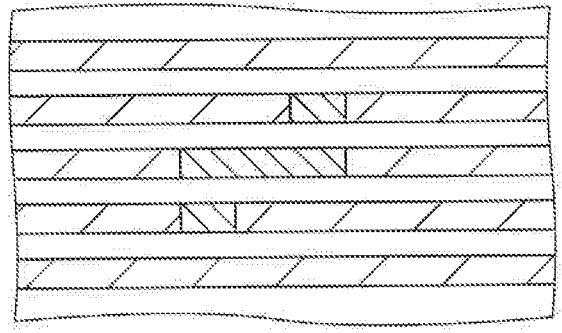
FIG. 36A
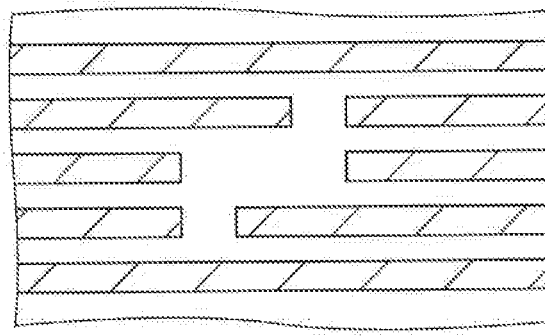
FIG. 36B
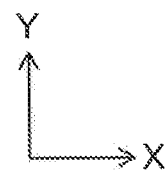

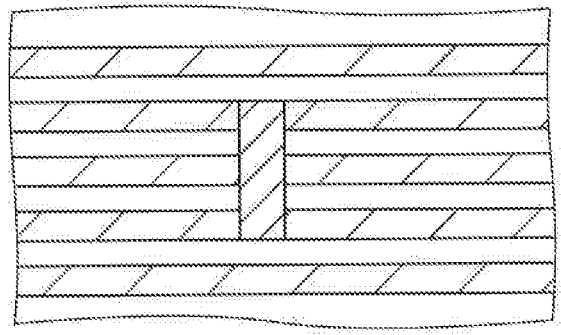
FIG. 38A
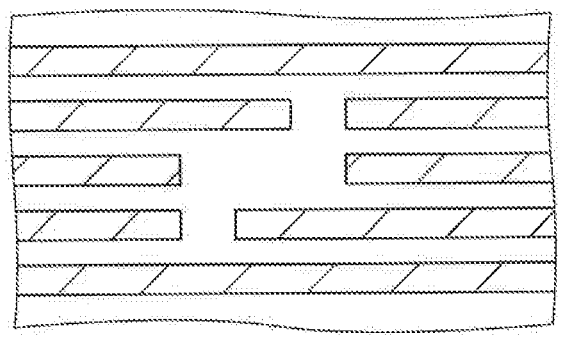
FIG. 38B
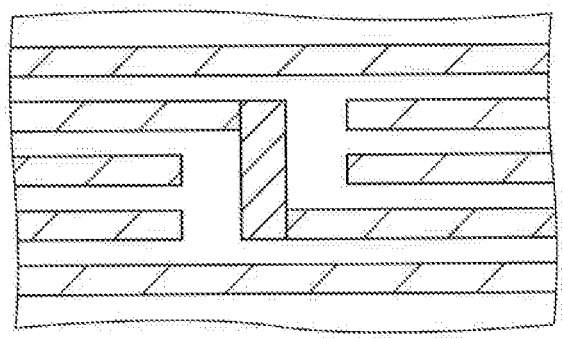
FIG. 38C
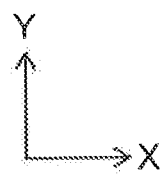

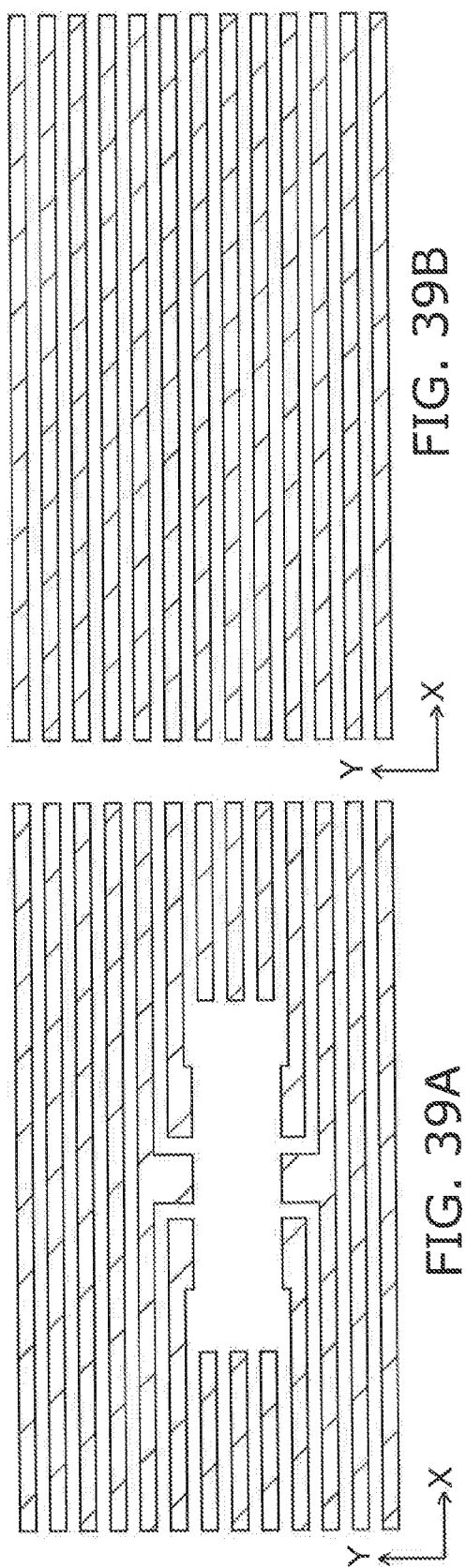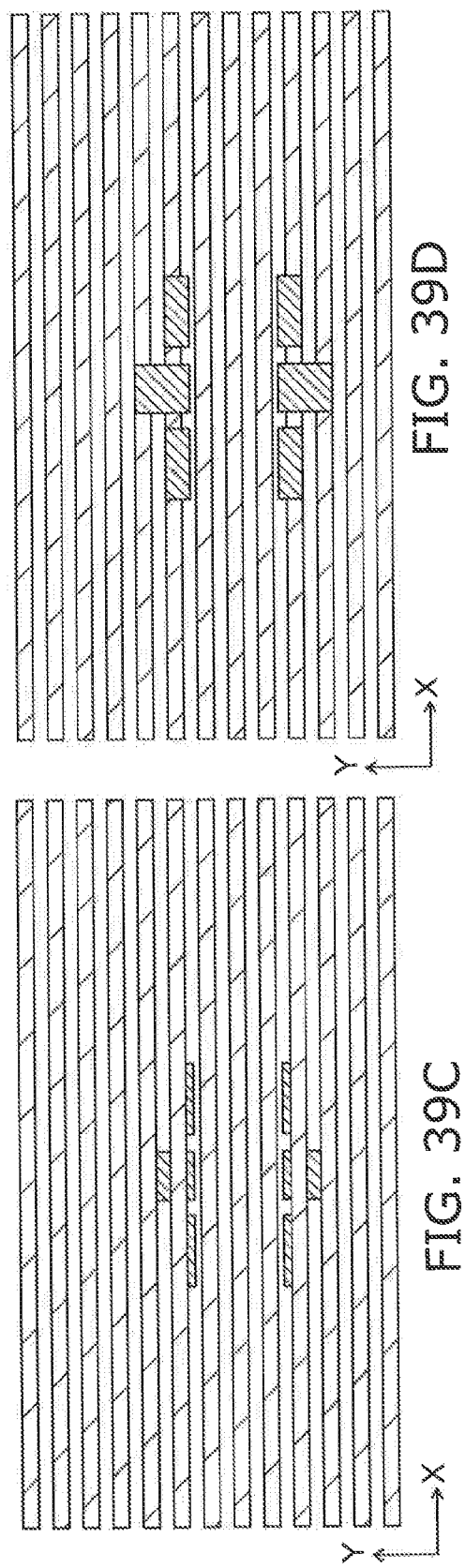
FIG. 39A  FIG. 39B  FIG. 39C  FIG. 39D

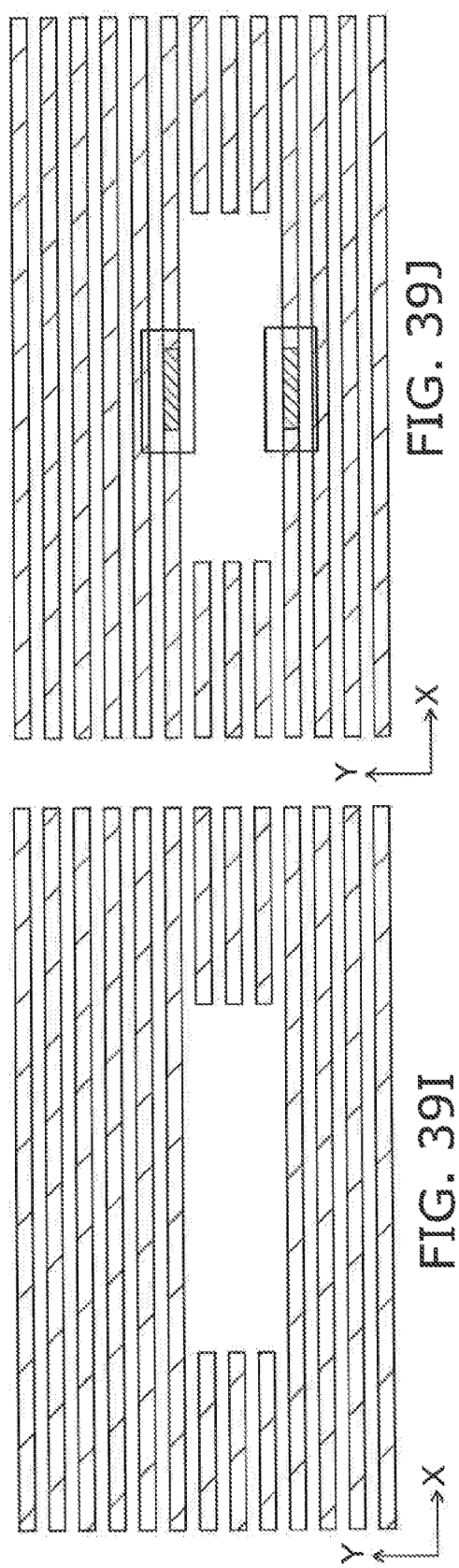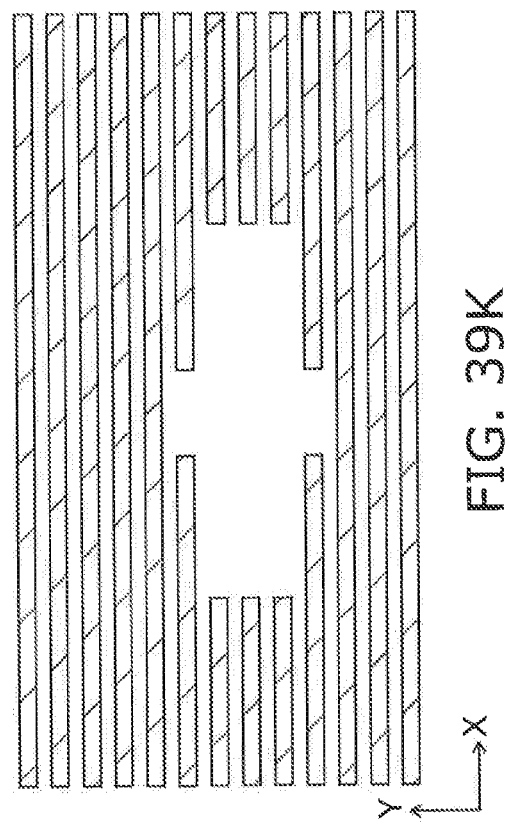
FIG. 39I  FIG. 39J  FIG. 39K

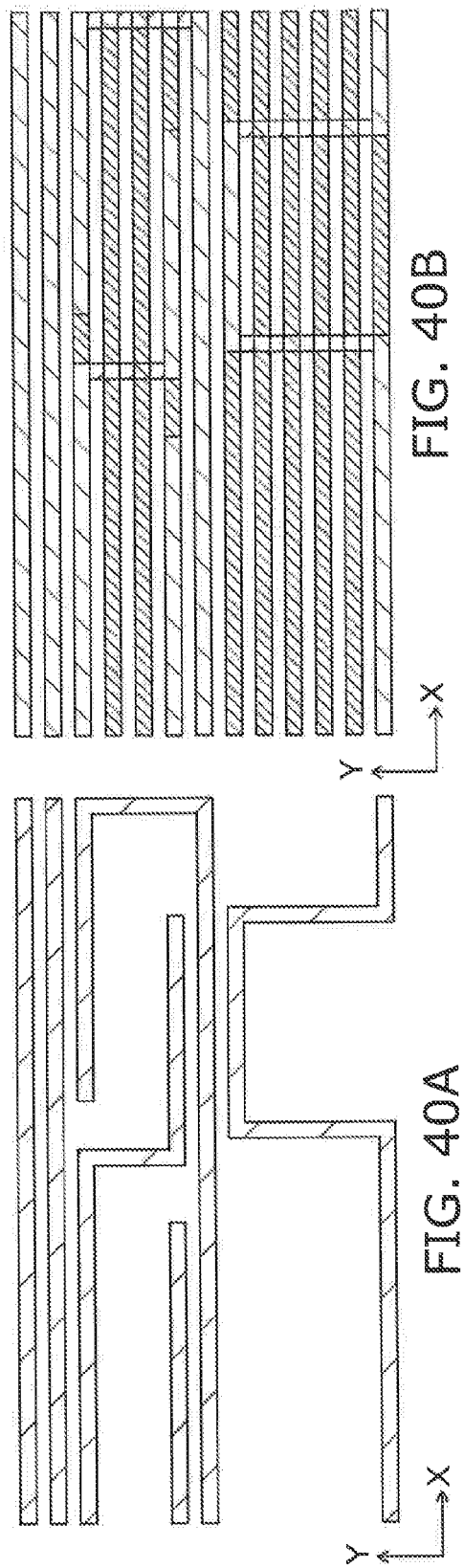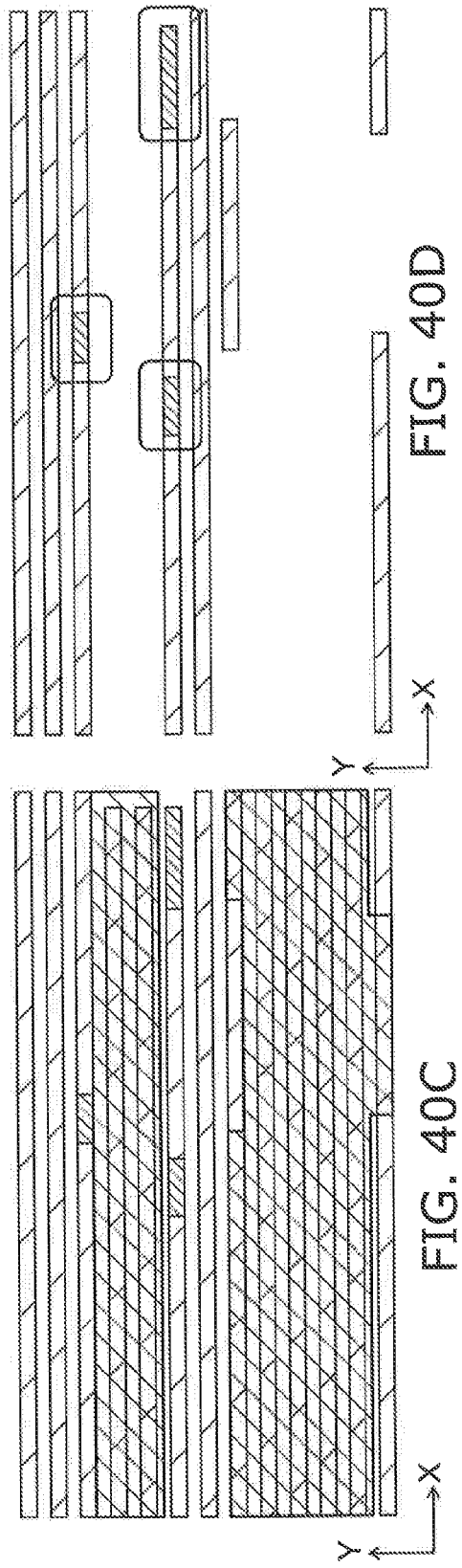

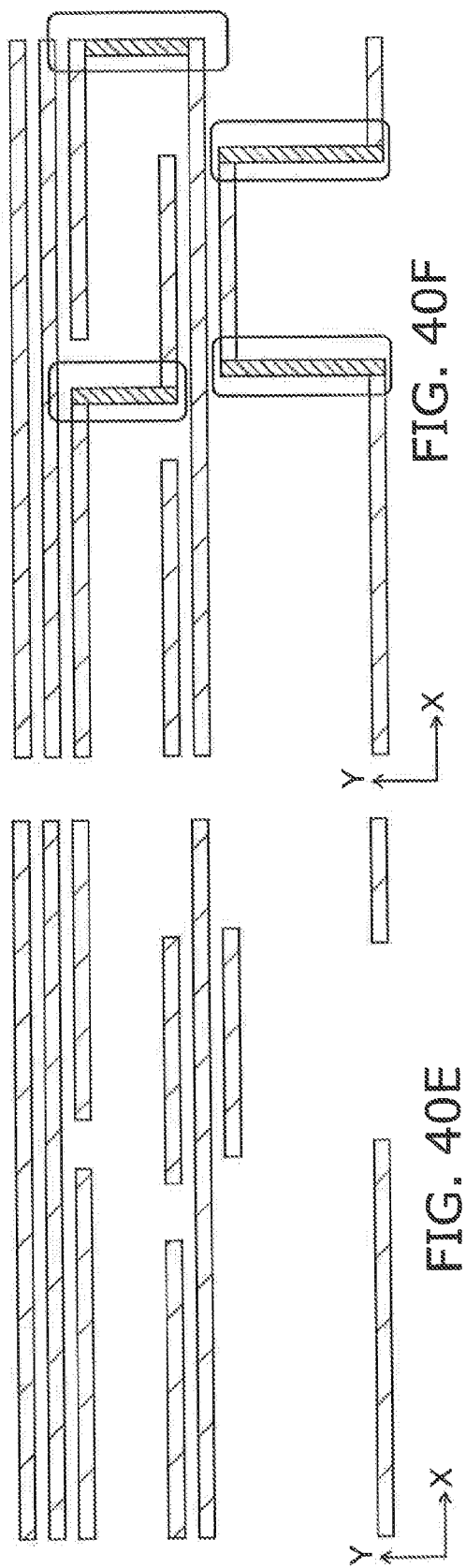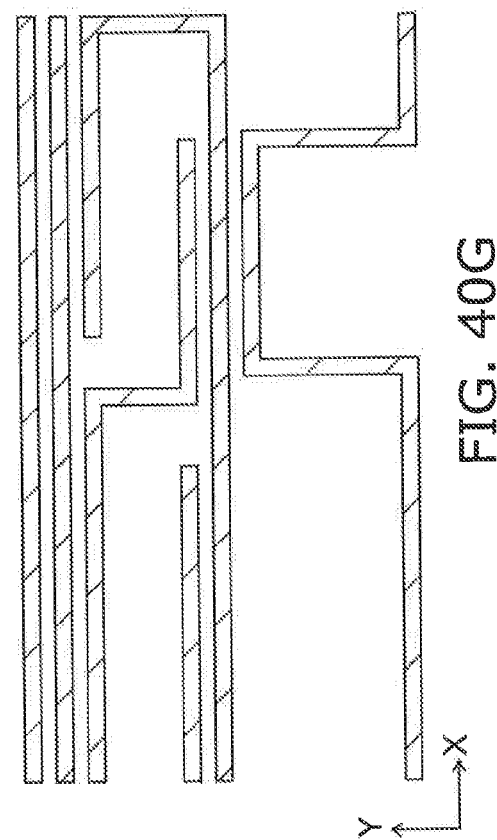
FIG. 40E
FIG. 40F
FIG. 40G

METHOD FOR GENERATING MASK DATA AND METHOD FOR MANUFACTURING INTEGRATED CIRCUIT DEVICE

CROSS-REFERENCE TO RELATED APPLICATIONS

This application is based upon and claims the benefit of priority from the prior Japanese Patent Application No. 2012-218043, filed on Sep. 28, 2012; the entire contents of which are incorporated herein by reference.

FIELD

Embodiments described herein relate generally to a method for generating mask data and a method for manufacturing an integrated circuit device.

BACKGROUND

In recent years, higher integration of semiconductor devices has progressed; and it has become necessary to form fine patterns exceeding the limits of photolithography. Therefore, several techniques that can form fine patterns have been proposed to replace photolithography. So-called DSA (Directed Self Assembly) technique which forms a pattern by utilizing a micro phase separation of a high polymer is drawing attention as one such technique. However, in DSA, the formation of complex two-dimensional patterns such as interconnects of circuits has been difficult.

BRIEF DESCRIPTION OF THE DRAWINGS

FIG. 6 shows a method for setting a region V2 of a second embodiment;

FIGS. 9A to 9D show the method for setting the region V3 of a fifth embodiment;

FIGS. 12A to 12D, FIGS. 13A to 13D, FIGS. 14A to 14D, and FIGS. 15A to 15D are cross-sectional views of processes showing an interconnect formation method for a cutting process according to the seventh embodiment;

FIG. 21 shows a method for setting a region V2 of a ninth embodiment;

FIGS. 32A to 32E, FIGS. 33A to 33E, and FIGS. 34A to 34D show a method for manufacturing an integrated circuit device according to a twelfth embodiment;

FIGS. 35A to 35C and FIGS. 36A and 36B show a cutting process of a thirteenth embodiment;

FIGS. 37A to 37C and FIGS. 38A to 38C show a connecting process of the thirteenth embodiment;

FIG. 39A to FIG. 39K show a method for manufacturing an integrated circuit device according to a fourteenth embodiment; and FIG. 40A to FIG. 40G show a method for manufacturing an integrated circuit device according to a fifteenth embodiment.

DETAILED DESCRIPTION

Figure 1A:
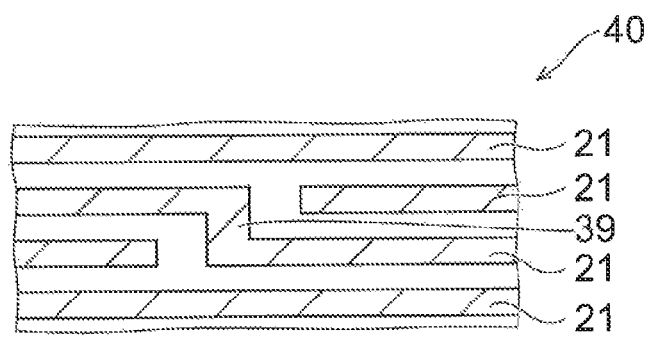
FIGS. 1A to 1E are process plan views showing a method for manufacturing an integrated circuit device according to a first embodiment.

In general, according to one embodiment, a method for generating mask data is configured to form a circuit pattern on a substrate using a directed self-assembly material. The method includes extracting a first region, setting a second region and setting a third region. The first region does not exist in the circuit pattern and exists in an initial pattern. The initial pattern includes a plurality of interconnect patterns extending in a first direction. The second region is formed by elongating the first region in a second direction intersecting the first direction. The second region straddles the first region in the second direction. The third region includes at least one of the second regions. The directed self-assembly material is disposed in the third region.

In general, according to one embodiment, a method for manufacturing an integrated circuit device includes making an opening in a region of a guide mask film corresponding to a third region by patterning the guide mask film using a mask made based on mask data. The mask data is generated by the above-mentioned method for generating mask data. The method for manufacturing the integrated circuit device includes disposing the directed self-assembly material inside the opening, phase-separating the directed self-assembly material into a first block made of a first phase and a second block made of a second phase to dispose the second block in a region corresponding to the second region, removing the second block, and performing processing using the guide mask film and the first block as a mask.

In general, according to one embodiment, a method for generating mask data is configured to form a circuit pattern on a substrate using a directed self-assembly material. The method includes extracting a first region, extracting a second region, setting a third region and setting a fourth region. The first region exists in the circuit pattern and does not exist in an initial pattern. The initial pattern includes a plurality of interconnect patterns extending in a first direction. The second region is a portion of the interconnect pattern contacting the first region. The second region is positioned in a second direction intersecting the first direction as viewed from the first region. The third region is formed by elongating the first region to include all of the second regions contacting the first region. The fourth region includes at least one of the third regions. The directed self-assembly material is disposed in the fourth region.

In general, according to one embodiment, a method for manufacturing an integrated circuit device includes making an opening in a region of a guide mask film corresponding to a fourth region by patterning the guide mask film using a mask made based on mask data. The mask data is generated by the above-mentioned method for generating mask data. The method for manufacturing the integrated circuit device includes disposing the directed self-assembly material inside the opening, phase-separating the directed self-assembly material into a first block made of a first phase and a second block made of a second phase to dispose the second block in a region corresponding to the third region, removing the second block, and performing processing using the guide mask film and the first block as a mask.

Embodiments of the invention will now be described with reference to the drawings.

First, a first embodiment will be described.

The entire flow of a method for manufacturing an integrated circuit device according to the embodiment will now be described.

FIGS. 1A to 1E are process plan views showing the method for manufacturing the integrated circuit device according to the embodiment.

FIGS. 1A to 1E are schematic drawings showing the entire flow and do not correspond rigorously to the actual processes. The detailed content of each of the processes is described below. Although interconnects 21 are illustrated by hatching for easier viewing of the drawing, the hatching does not indicate a cross section. This is similar for other plan views described below.

First, as shown in FIG. 1A, a circuit pattern is set for the integrated circuit device 40 to be manufactured. In the circuit pattern, two mutually-adjacent interconnects 21 are connected in a crank-like configuration via a conductive member 39 and are insulated from the other interconnects 21.

Figure 1B:
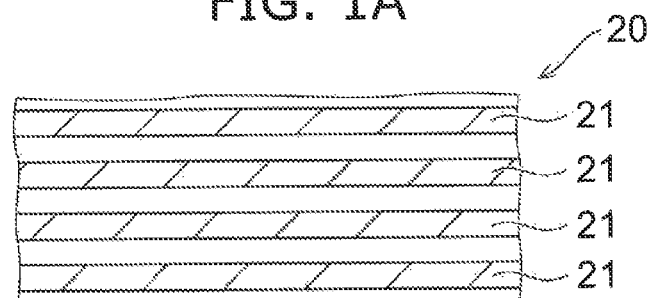

On the other hand, as shown in FIG. 1B, an initial structural body 20 is prepared in which an initial circuit is formed on a substrate. In the initial circuit, multiple interconnects 21 extending in the same direction are periodically arranged. In the specification hereinbelow, the direction in which the interconnects 21 extend is taken as an X direction; and the arrangement direction of the interconnects 21 is taken as a Y direction. The widths of the interconnects 21 are, for example, about 10 nm. The initial circuit may be formed by, for example, a DSA process, a sidewall process, lithography using EUV (extreme ultraviolet), or lithography using an electron beam. In the embodiment, the integrated circuit device 40 is manufactured by starting from the initial structural body 20.

Figure 1C:
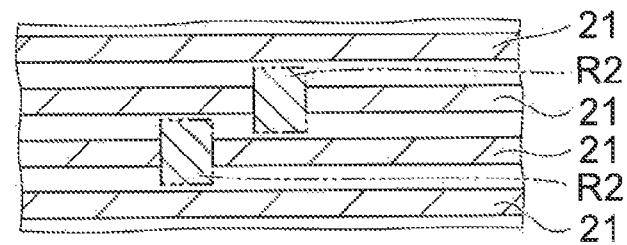

First, as shown in FIG. 1C, regions R2 are set to cover portions where the interconnects 21 of the initial circuit are to be cut.

Figure 1D:
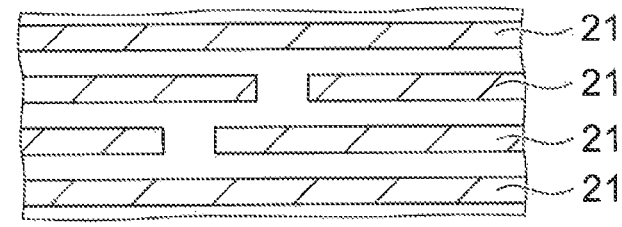

Then, as shown in FIG. 1D, the portions of the interconnects 21 disposed inside the regions R2 are removed using DSA. Thereby, the interconnects 21 are divided.

Figure 1E:
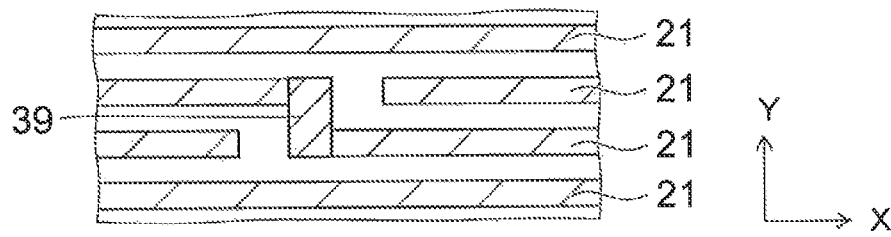

Continuing as shown in FIG. 1E, the conductive member 39 is formed using DSA at the portions of the interconnects 21 to be connected to each other. Thereby, an integrated circuit having the same pattern as the circuit pattern shown in FIG. 1A can be made.

Each of the processes of the method for manufacturing the integrated circuit device described above will now be described in detail.

As described above, the manufacturing processes of the integrated circuit device according to the embodiment are broadly divided into a cutting process to cut the interconnects (referring to FIGS. 1C and 1D) and a connecting process to connect the interconnects to each other (referring to FIG. 1E). The order of the cutting process and the connecting process is arbitrary. Multiple cutting processes and multiple connecting processes may be implemented in any order.

The cutting process and the connecting process are broadly divided into a mask data generation method configured to generate mask data to execute the cutting process using DSA and an interconnect formation method configured to form the actual interconnects by DSA using a mask that is made based on the mask data. The mask data generation method is virtual processing performed by a computer. On the other hand, the interconnect formation method is the substantial processing performed on the actual device. In the specification, "interconnect formation" includes not only the case where the entire interconnect is created collectively but also the case where patterning such as removing or adding a portion from or to an interconnect that already exists is performed on the interconnect, etc.

Accordingly, the method for manufacturing the integrated circuit device according to the embodiment can be divided into the component methods of <1> to <4> recited below and can be executed by combining the component methods.

<1> Mask data generation method for the cutting process
<2> Interconnect formation method for the cutting process
<3> Mask data generation method for the connecting process
<4> Interconnect formation method for the connecting process Each of the methods of <1> to <4> recited above will now be described.

<1> Mask data generation method for the cutting process

FIGS. 2A to 2F show a method for generating the mask data for the cutting process of the embodiment.

Figure 2A:
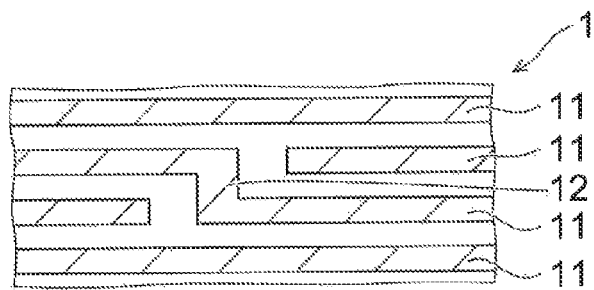
FIGS. 2A to 2F show a method for generating a mask data for a cutting process of the first embodiment.

As shown in FIG. 2A, a circuit pattern 1 to be ultimately made is set. The circuit pattern 1 is a pattern in which, for example, multiple interconnect patterns 11 extending in the X direction are arranged periodically to be parallel to each other; and two mutually-adjacent interconnect patterns 11 are connected via a connection portion 12 and separated from the other interconnect patterns 11. However, the design of the circuit pattern 1 is not limited thereto.

Figure 2B:
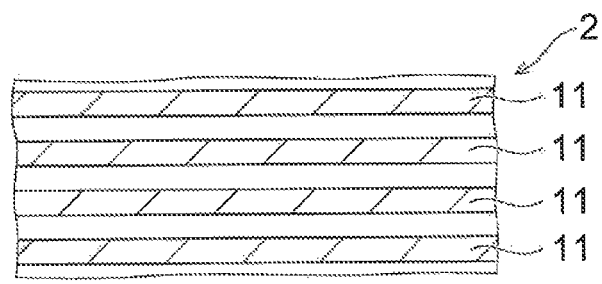

On the other hand, an initial pattern 2 is set as shown in FIG. 2B. The initial pattern 2 is made of the multiple interconnect patterns 11 periodically arranged to extend in the X direction. The widths and the arrangement period of the interconnect patterns 11 of the initial pattern 2 are the same as the widths and the arrangement period of the interconnect patterns 11 of the circuit pattern 1.

Figure 2C:
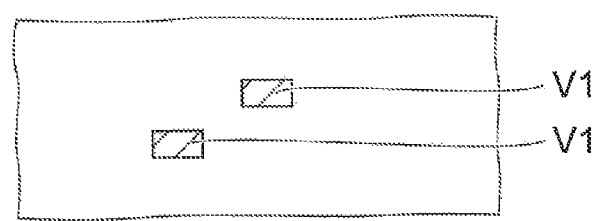

Then, as shown in FIG. 2C, regions V1 existing in the initial pattern 2 and not existing in the circuit pattern 1 are extracted. The regions V1 correspond to the portions of the actual interconnects 21 corresponding to the interconnect patterns 11 to be removed. The regions V1 can be obtained by performing, for example, the Boolean operation of {(initial pattern 2) NOT (circuit pattern 1)}.

Figure 2D:
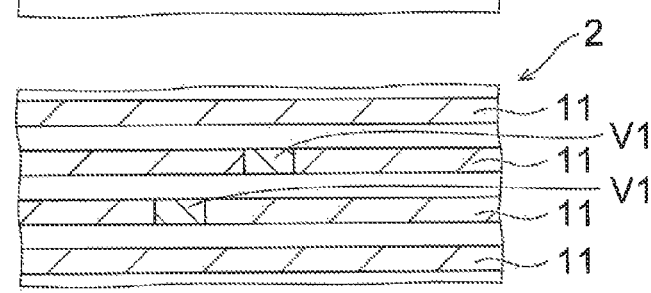

Then, as shown in FIG. 2D, the regions V1 are overlaid on the initial pattern 2.

Figure 2E:
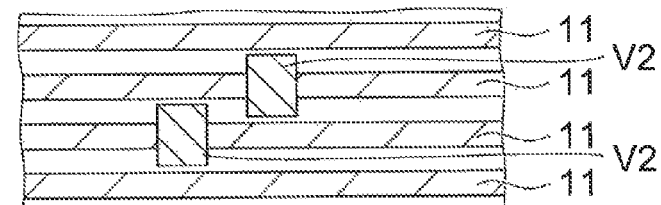

Continuing as shown in FIG. 2E, regions V2 are set by elongating both Y-direction sides of each of the regions V1. The region V2 is set to straddle the region V1 in the Y direction and not to reach the adjacent interconnect patterns 11.

Figure 2F:
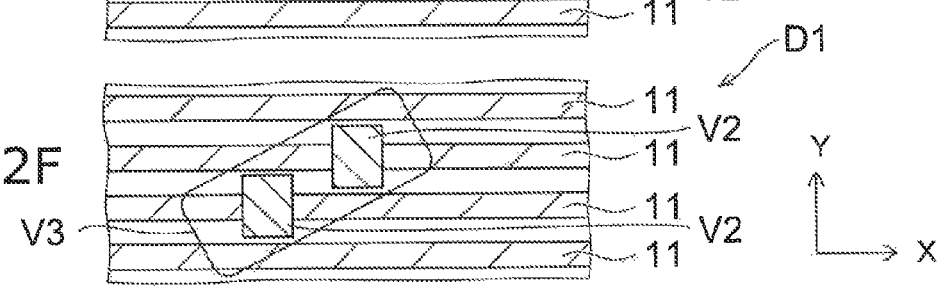

Then, as shown in FIG. 2F, a region V3 is set to include at least one of the regions V2. The region V3 is set such that a block of the same phase is disposed in all of the regions V2 when a directed self-assembly material (DSA material) is disposed in the interior of the region V3 and caused to phase-separate. Accordingly, the configuration and the size of the region V3 depends on the number and the arrangement spacing of the regions V2 included in the region V3, the size and the configuration of each of the regions V2, the type and the conditions of the phase separation of the DSA material, etc. In the example shown in FIG. 2F, the region V3 includes two regions V2; and the outer edge of the region V3 is set to be positioned outside the outer edge of the regions V2. Thereby, mask data D1 is generated in which the region V3 is set. The interconnect patterns 11, the regions V1, and the regions V2 are not included in the mask data D1.

<2> Interconnect formation method for the cutting process

FIGS. 3A to 3E are process plan views showing the interconnect formation method for the cutting process of the embodiment.

Figure 3A:
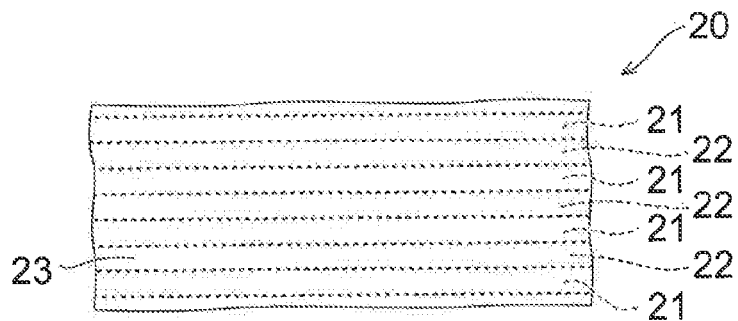
FIGS. 3A to 3E are process plan views showing an interconnect formation method for the cutting process of the first embodiment.

First, as shown in FIG. 3A, the initial structural body 20 is prepared in which the multiple interconnects 21 are provided on the substrate (not shown), an inter-interconnect insulating film 22 is provided between the interconnects 21, and a guide mask film 23 is provided above the interconnects 21 and the inter-interconnect insulating film 22. The pattern of the interconnects 21 corresponds to the initial pattern 2 (referring to FIG. 2B).

Figure 3B:
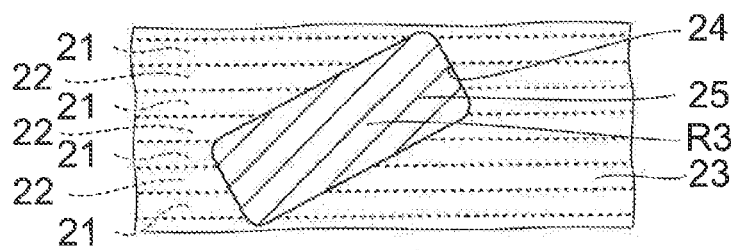

Then, as shown in FIG. 3B, the guide mask 23 is patterned by performing lithography using a mask (not shown) that is made based on the mask data D1 shown in FIG. 2F. Thereby, an opening 24 is made in a region R3 that corresponds to the region V3 of the guide mask 23. Then, a DSA material 25 is coated to be filled into the opening 24. The DSA material 25 may include, for example, a diblock polymer, a blended polymer, etc.

Figure 3C:
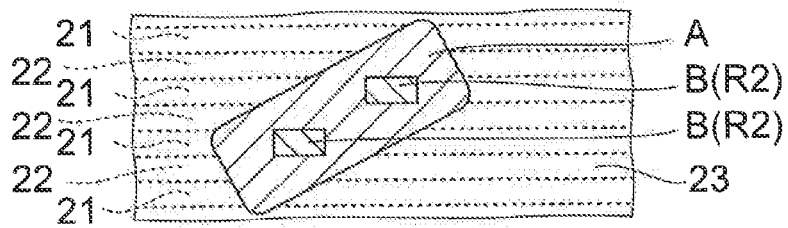

Continuing as shown in FIG. 3C, the DSA material 25 is phase-separated and cured by performing, for example, heat treatment. Thereby, the DSA material 25 is separated into a block A made of a first phase and a block B made of a second phase and is disposed regularly inside the opening 24. At this time, the block B is disposed in the regions R2 that correspond to the regions V2.

Figure 3D:
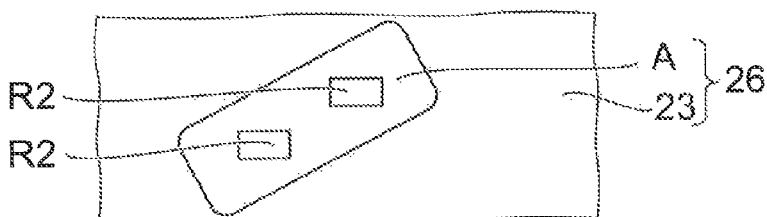

Then, as shown in FIG. 3D, the block B is removed with the block A left as-is. Thereby, a mask pattern 26 made of the guide mask film 23 and the block A is formed in which the regions R2 are removed.

Figure 3E:
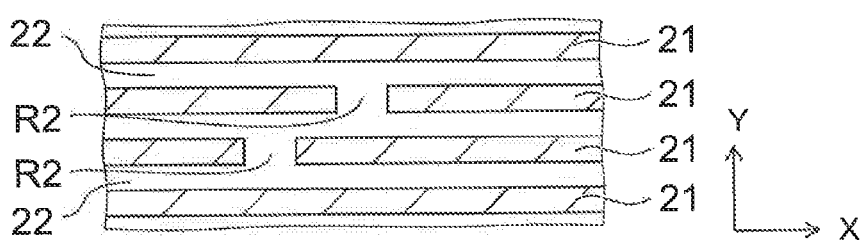

Continuing as shown in FIG. 3E, etching is performed using the mask pattern 26 as a mask. Thereby, the interconnects 21 are cut by the portions of the interconnects 21 disposed in the regions R2 being removed. Subsequently, the mask pattern 26 is removed. Thereby, an intermediate structural body 30 is made in which the interconnects 21 in the regions R2 are cut.

<3> Mask data generation method for the connecting process

FIGS. 4A to 4F show a method for generating the mask data for the connecting process of the embodiment.

Figure 4A:
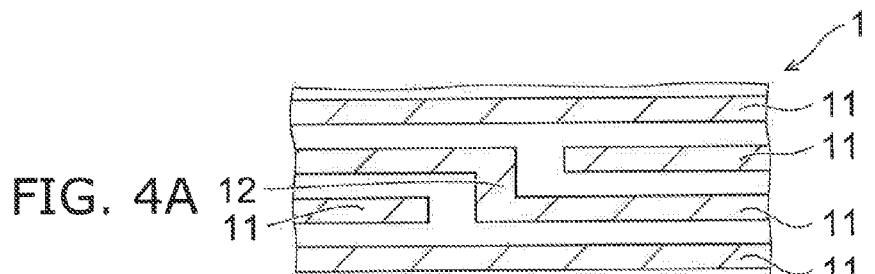
FIGS. 4A to 4F show a method for generating the mask data for a connecting process of the first embodiment.
Figure 4B:
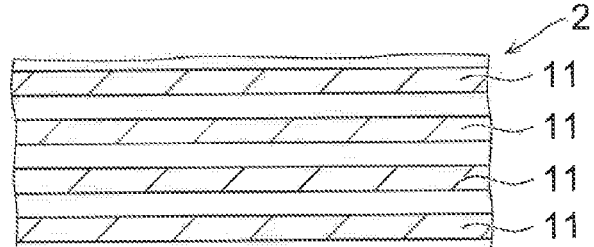

First, a region V4 (referring to FIG. 4C) existing in the circuit pattern 1 to be made that is shown in FIG. 4A and not existing in the initial pattern 2 shown in FIG. 4B is extracted.

Figure 4C:
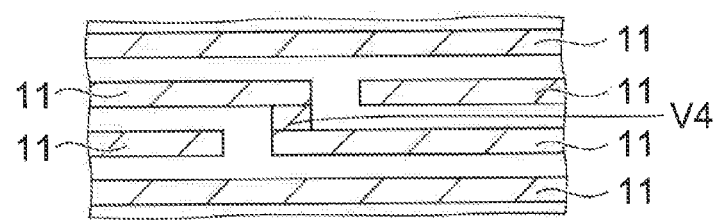

As shown in FIG. 4C, the region V4 corresponds to the portion between the actual interconnects 21 (referring to FIG. 1A) corresponding to the interconnect patterns 11 to be connected. The region V4 can be obtained by performing, for example, the Boolean operation of {(circuit pattern 1) NOT (initial pattern 2)}. Then, the region V4 is overlaid on the circuit pattern 1.

Figure 4D:
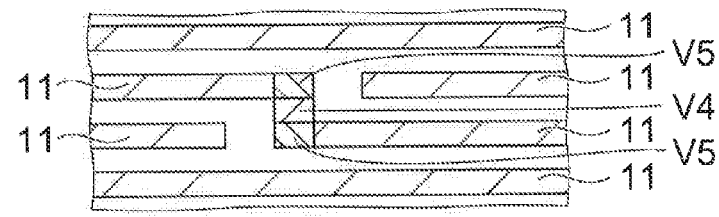

Continuing as shown in FIG. 4D, regions V5 of the interconnect patterns 11 contacting the region V4 are extracted. The lengths of the regions V5 in the X direction are equal to that of the region V4; and the lengths of the regions V5 in the Y direction are equal to the width of the interconnect pattern 11. In this case, two regions V5 positioned on the two Y-direction sides of one region V4 are extracted.

Figure 4E:
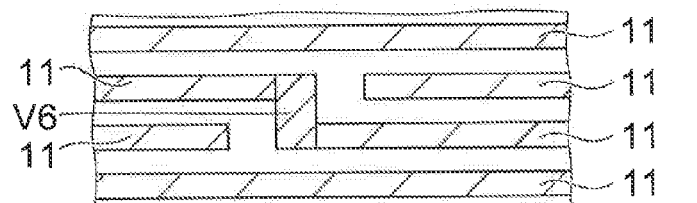

Then, as shown in FIG. 4E, a region V6 is set by elongating the region V4 to include all of the regions V5 contacting the region V4. In other words, the region V6 is made by elongating each of the two Y-direction sides of the region V4 by the width of the interconnect pattern 11.

Figure 4F:
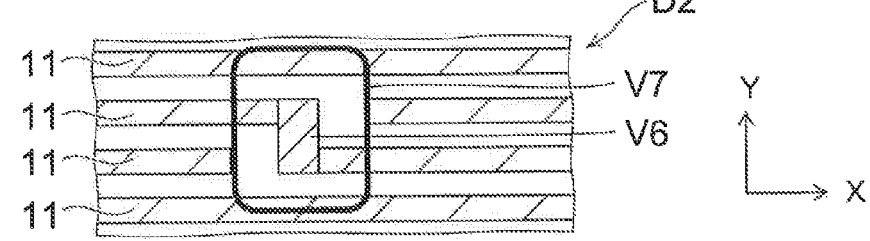

Continuing as shown in FIG. 4F, a region V7 is set to include at least one region V6. The region V7 is set such that a block of the same phase is disposed in all of the regions V6 when the DSA material is disposed in the interior of the region V7 and caused to phase-separate. Accordingly, the configuration and the size of the region V7 depends on the number and the arrangement spacing of the regions V6 included in the region V7, the size and the configuration of the region V6, the type and the conditions of the phase separation of the DSA material, etc. In the example shown in FIG. 4F, the region V7 includes one region V6; and the outer edge of the region V7 is set to be positioned outside the outer edge of the region V6. Thereby, mask data D2 is generated in which the region V7 is set. The interconnect patterns 11 and the regions V4 to V6 are not included in the mask data D2.

<4> Interconnect formation method for the connecting process

FIGS. 5A to 5E are process plan views showing an interconnect formation method for the connecting process of the embodiment.

Figure 5A:
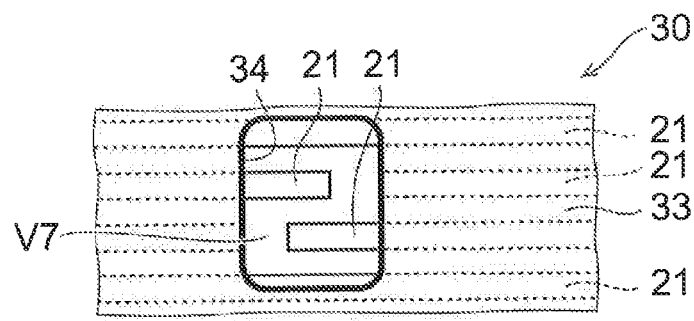
FIGS. 5A to 5E are process plan views showing an interconnect formation method for the connecting process of the first embodiment.

First, as shown in FIG. 5A, a guide mask film 33 is formed on the intermediate structural body 30 shown in FIG. 3E. Then, the guide mask film 33 is patterned by performing lithography using a mask (not shown) that is made based on the mask data D2 shown in FIG. 4G. Thereby, an opening 34 is made in a region R7 of the guide mask film 33 corresponding to the region V7 (referring to FIG. 4F).

Figure 5B:
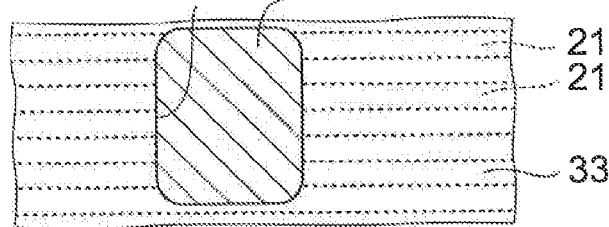

Then, as shown in FIG. 5B, a DSA material 35 is coated to be filled into the opening 34.

Figure 5C:
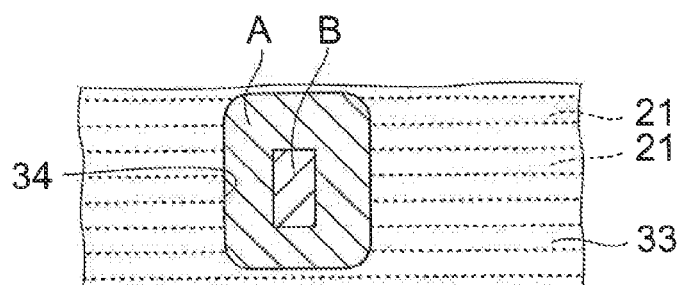

Continuing as shown in FIG. 5C, the DSA material 35 is caused to phase-separate and cure by performing, for example, heat treatment. Thereby, the block A made of the first phase and the block B made of the second phase are formed and are disposed regularly inside the opening 34. At this time, the block B is disposed in a region R6 that corresponds to the region V6.

Figure 5D:
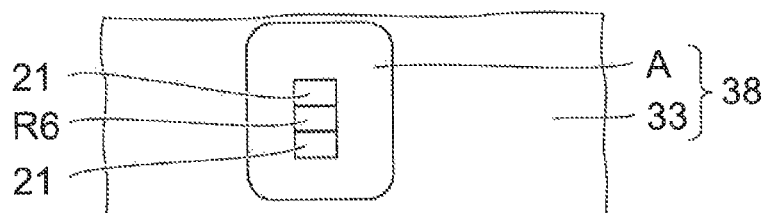

Then, as shown in FIG. 5D, the block B is removed with the block A left as-is. Thereby, a mask pattern 38 made of the guide mask film 33 and the block A is formed in which the region R6 is removed.

Figure 5E:
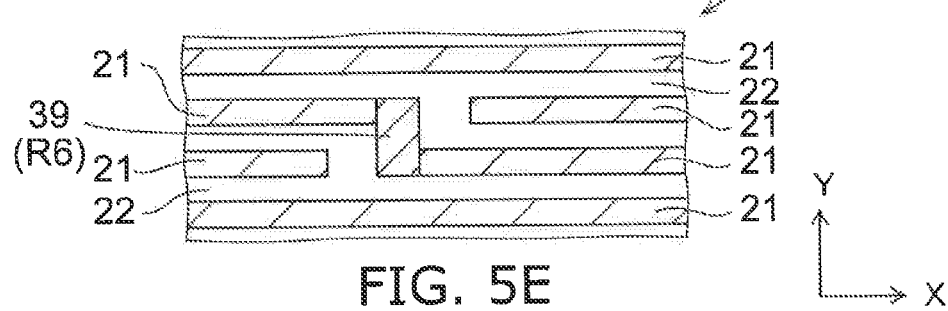

Continuing as shown in FIG. 5E, a conductive material is deposited using the mask pattern 38 as a mask. Thereby, the conductive member 39 is formed in the region R6; and the interconnects 21 are connected to each other. Then, the mask pattern 38 is removed. Thereby, the integrated circuit device 40 is manufactured in which the interconnects 21 are cut in the regions R2 and the interconnects 21 are connected in a region R4. The circuit pattern of the integrated circuit device 40 corresponds to the circuit pattern 1.

Effects of the embodiment will now be described.

According to the embodiment, fine interconnects can be cut and connected using DSA. Then, an integrated circuit of any circuit pattern can be made by repeating the cutting and the connecting of the interconnects. As a result, an integrated circuit device having high integration can be manufactured.

A second embodiment will now be described.

The embodiment is a modification of the process of setting the region V2 (referring to FIG. 2D) by causing the region V1 (referring to FIG. 2C) to elongate in the mask data generation method for the cutting process of <1> described above. In the embodiment, the size of the region V2 is set by considering the alignment shift and the patterning conversion difference in the patterning.

FIG. 6 shows a method for setting the region V2 of the embodiment.

As shown in portion A of FIG. 6, the length of the region V1 in the Y direction is equal to a width w of the interconnect pattern 11.

However, as shown in portion B of FIG. 6, there is a possibility that a portion of the interconnect 21 may remain in the region of the interconnect 21 to be cut and the interconnect 21 may not be cut well in the case where an alignment shift and/or a patterning conversion difference amount occur in the patterning in the case where the region V1 is set as-is to be the region where the actual interconnect 21 is removed.

Therefore, as shown in portion C of FIG. 6, it is favorable for the length of the region V2 in the Y direction to be not less than the sum of the length of the original region V1 and the maximum value u of the alignment shift that is assumed for the guide mask film.

As shown in portion D of FIG. 6, it is necessary for the length of the region V2 in the Y direction to be a length such that the region V2 does not contact the adjacent interconnect pattern 11. The length w+u in the Y direction of the region shown in portion C of FIG. 6 can be further elongated without contacting the adjacent interconnect pattern 11 by a length that is taken as v.

As shown in portions E and F of FIG. 6, it is favorable for the length of the region V2 in the Y direction to be the sum of the length of the original region V1 and twice a patterning conversion difference amount Zy, where the patterning conversion difference amount in the X direction is Zx and the patterning conversion difference amount in the Y direction is Zy when the circuit pattern 1 is transferred onto the initial structural body 20. The patterning conversion difference amounts Zx and Zy can have both positive and negative values.

Summarizing the description recited above, it is favorable for the elongated amount when setting the region V2 by elongating the region V1 in the Y direction, i.e., the difference between the length of the region V2 and the length of the region V1 in the Y direction, to be not less than u+2Zy and not more than u+2Zy+v. It is favorable for the elongated amount in the X direction to be 2Zx. Thus, according to the embodiment, the interconnects 21 can be reliably cut and the effects on the adjacent interconnects 21 can be avoided by determining the length of the region V2 in the Y direction based on the length of the region V1 in the Y direction, the patterning conversion difference amount of the guide mask film, and the alignment shift that is assumed for the guide mask film.

Otherwise, the configuration, the operations, and the effects of the embodiment are similar to those of the first embodiment described above.

A third embodiment will now be described.

The embodiment is a modification of the process of setting the region V2 (referring to FIG. 2D) based on the region V1 (referring to FIG. 2C) in the mask data generation method for the cutting process of <1> described above. In the embodiment, the region V2 is set by linking multiple regions V1.

FIGS. 7A to 7E show the method for setting the region V2 of the embodiment.

Figure 7A:
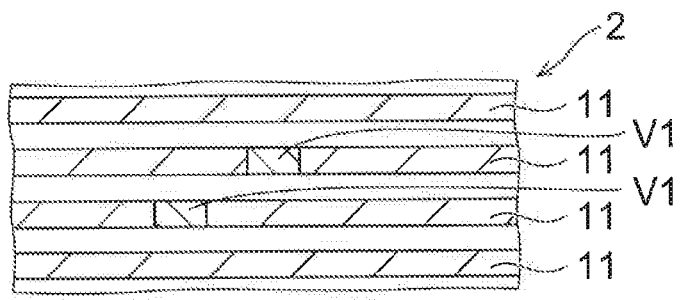
FIGS. 7A to 7E show the method for setting the region V2 of a third embodiment.

The pattern shown in FIG. 7A is similar to the pattern shown in FIG. 2D. Namely, the regions V1 overlap the initial pattern 2.

Figure 7B:
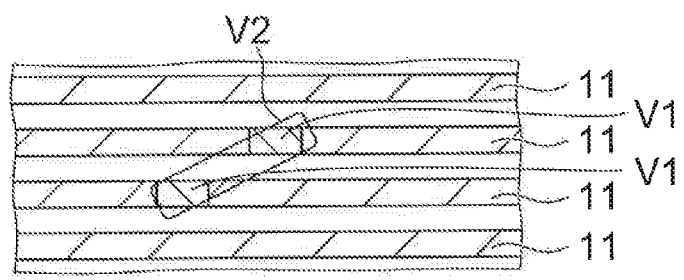
Figure 7C:
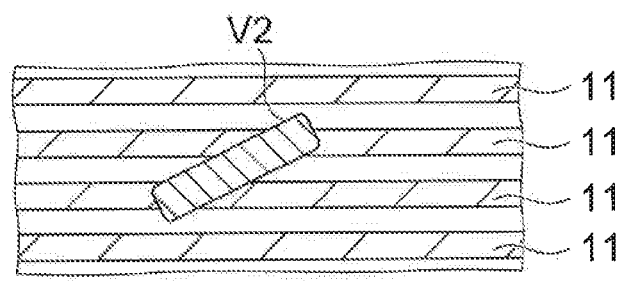

From this state, the region V2 is set such that multiple, e.g., two, regions V1 are linked (merged) as shown in FIGS. 7B and 7C.

Figure 7D:
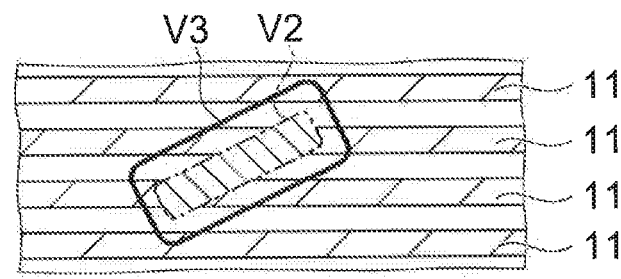

At this time, as shown in FIG. 7D, the size of the region V2 may be set by considering the alignment shift and the patterning conversion difference amount.

Figure 7E:
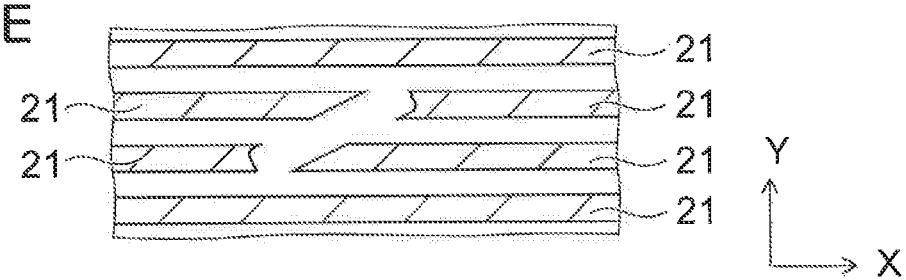

Then, the mask data D1 (referring to FIG. 2F) is generated by setting the region V3 (referring to FIG. 2F) based on the region V2. Then, the interconnects 21 can be cut as shown in FIG. 7E by implementing the interconnect formation method for the cutting process (referring to FIGS. 3A to 3E) of <2> described above.

According to the embodiment as well, the interconnects can be cut using DSA. Otherwise, the configuration, the operations, and the effects of the embodiment are similar to those of the first embodiment described above.

A fourth embodiment will now be described.

The embodiment is a modification of the process of setting the region V3 (referring to FIG. 2F) based on the region V2 (referring to FIG. 2E) in the mask data generation method for the cutting process of <1> described above. In the embodiment, the optimal region V3 is set by searching a database in which data of the region V3 is stored.

FIGS. 8A to 8E show a method for setting the region V3 of the embodiment.

Figure 8A:
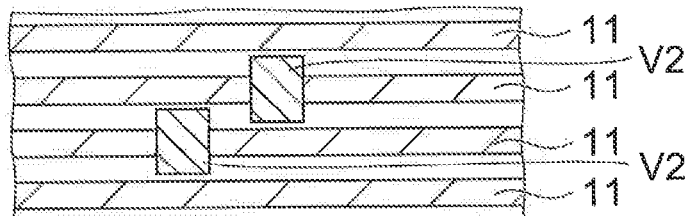
FIGS. 8A to 8E show a method for setting a region V3 of a forth embodiment.

The regions V2 are set as shown in FIG. 8A. This stage is similar to the stage shown in FIG. 2E.

Figure 8B:
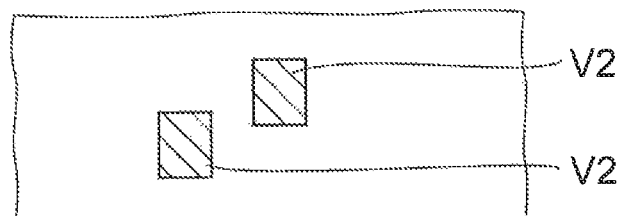

Then, as shown in FIG. 8B, the regions V2 are extracted from the data shown in FIG. 8A.

Figure 8C:
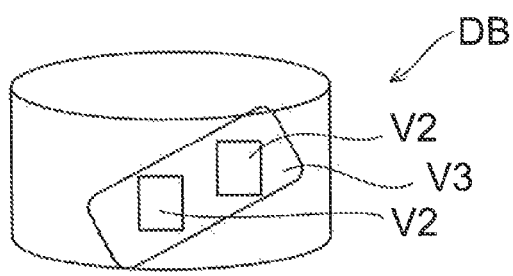

On the other hand, a database DB is prepared as shown in FIG. 8C. First, a library is prepared to store multiple guide pattern data having mutually different sizes and configurations. The guide patterns correspond to the openings 24 made in the regions R3 of the guide mask film 23 in real space and correspond to the regions V3 in the mask data. Then, the configurations of the blocks A and B after the DSA material is disposed inside the guide pattern and caused to phase-separate are acquired as block pattern data for the guide pattern data stored in the library. Then, the block pattern data is stored in the library to have a correspondence with the guide pattern data. Then, the block pattern data stored in the library that has the same configuration as the regions V2 or a configuration including the regions V2 is found; and the guide pattern data that corresponds to the block pattern data is extracted.

Figure 8D:
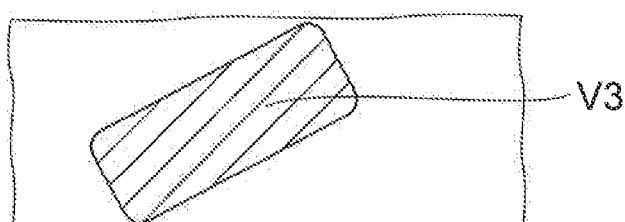
Figure 8E:
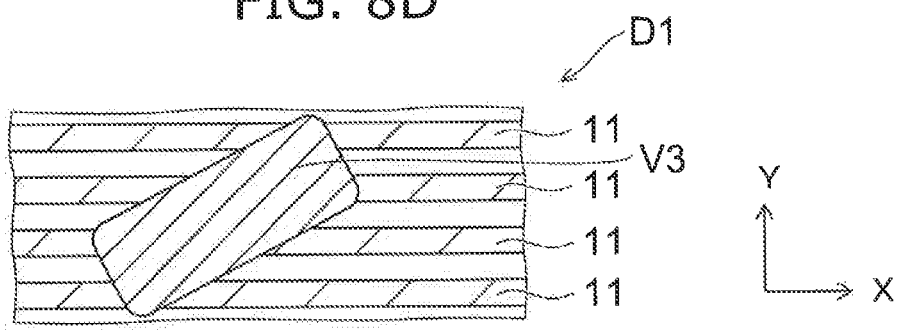

Thereby, as shown in FIG. 8D, the optimal region V3 is selected by inputting the variables of the regions V2 to the database DB. Then, as shown in FIG. 8E, the mask data D1 is generated by overlaying the region V3 onto the initial pattern 2.

According to the embodiment, the region V3 can be set rapidly. Otherwise, the configuration, the operations, and effects of the embodiment are similar to those of the first embodiment described above.

A fifth embodiment will now be described.

The embodiment is a modification of the process of setting the region V3 (referring to FIG. 2F) based on the region V2 (referring to FIG. 2E) in the mask data generation method for the cutting process of <1> described above. In the embodiment, the process of setting the region V3 is implemented multiple times.

FIGS. 9A to 9D show the method for setting the region V3 of the embodiment.

In the embodiment, the two constraint conditions of (1) and (2) recited below are provided when setting the region V3.

(1) Do not dispose the regions V3 to be proximal to each other.

(2) All of the regions V3 mirrored by one mask have the same configuration and the same size.

The reason for providing the constraint condition of (1) recited above is because resolution is difficult and transferring in the desired configuration is difficult when the regions V3 are proximal to each other. The reason for providing the constraint condition of (2) recited above is because one type of the DSA material is coated and the DSA material is optimized for a designated guide; and therefore, in the case where multiple types of the configuration and size of the region V3 are mirrored by one mask, the configurations and the sizes of the multiple openings 24 (referring to FIG. 3B) made in the guide mask film 23 have multiple types; and defects undesirably occur inside some types of openings 24. Therefore, it is favorable for the mask to be divided in the case where the constraint conditions of (1) and (2) recited above are not satisfied.

A specific application example will now be described.

The multiple regions V2 such as those shown in FIG. 9B are set to make the circuit pattern 1 such as that shown in FIG. 9A. At this time, the multiple regions V2 are divided into two groups to comply with the constraint conditions (1) and (2) described above. Then, as shown in FIG. 9C, mask data D11 is generated by setting the region V3 for the regions V2 of the first group. On the other hand, as shown in FIG. 9D, mask data D12 is generated by setting the region V3 for the regions V2 of the second group.

According to the embodiment, the mask data can be generated to cut the interconnects 21 at any position. If necessary, the region V3 may be divided into three or more groups. In such a case, three or more mask data are generated. Otherwise, the configuration, the operations, and the effects of the embodiment are similar to those of the first embodiment described above.

A sixth embodiment will now be described.

The embodiment is an example that implements the interconnect formation method for the cutting process of <2> in the case where the region V3 is divided to be set multiple times in the mask data generation method for the cutting process of <1> as in the fifth embodiment described above. In the embodiment, the DSA processing is implemented multiple times.

FIGS. 10A to 10F are process plan views showing the interconnect formation method for the cutting process of the embodiment.

In the embodiment, the two mask data D11 and D12 are generated by the method described in the fifth embodiment described above.

Figure 10A:
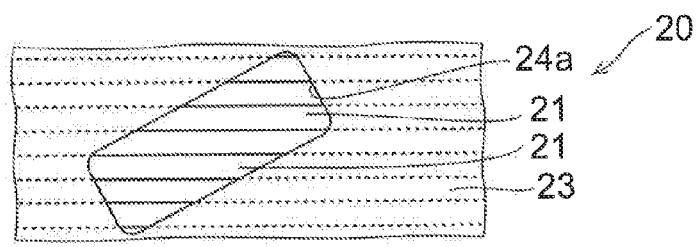
FIGS. 10A to 10F are process plan views showing an interconnect formation method for a cutting process of a sixth embodiment.

First, as shown in FIG. 10A, an opening 24a is made in the guide mask film 23 of the initial structural body 20 by performing lithography using a mask (not shown) that is made based on the mask data D11.

Figure 10B:
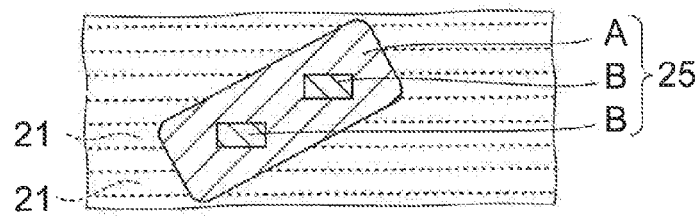

Then, as shown in FIG. 10B, the DSA material 25 is disposed inside the opening 24a and is caused to phase-separate into the block A and the block B.

Figure 10C:
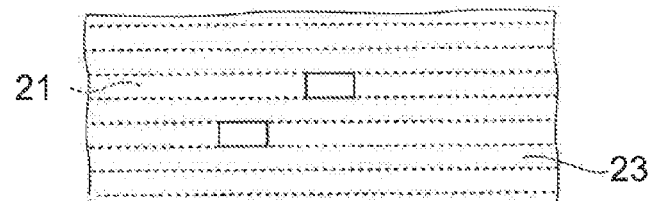

Then, as shown in FIG. 10C, the block B is removed and the interconnects 21 are selectively removed using the guide mask film 23 and the block A as a mask by methods similar to those of the first embodiment described above.

Figure 10D:
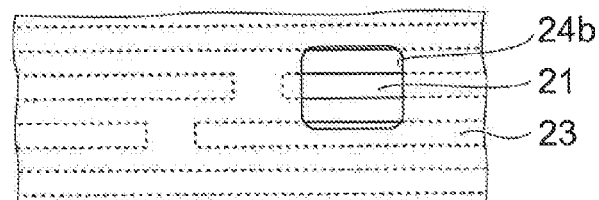

Continuing as shown in FIG. 10D, an opening 24b is made in the guide mask film 23 of the initial structural body 20 by performing lithography using a mask (not shown) that is made based on the mask data D12.

Figure 10E:
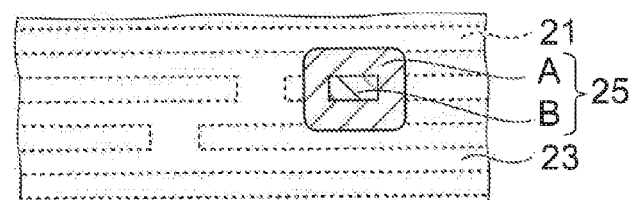

Then, as shown in FIG. 10E, the DSA material 25 is disposed inside the opening 24b; and the block A and the block B are caused to phase-separate.

Figure 10F:
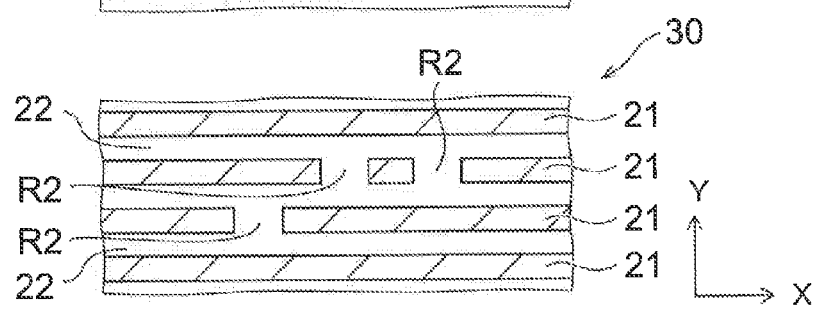

Continuing as shown in FIG. 10F, the block B is removed and the interconnects 21 are selectively removed using the guide mask film 23 and the block A as a mask by methods similar to those of the first embodiment described above. Thereby, the intermediate structural body 30 is made.

According to the embodiment, the interconnects 21 can be cut at any position. In the case where three or more mask data are generated, the DSA processing is performed three or more times. Otherwise, the configuration, the operations, and the effects of the embodiment are similar to those of the first embodiment described above.

A seventh embodiment will now be described.

The embodiment is an example in which the interconnect formation method for the cutting process of <2> is realized by a damascene process. In the embodiment, a material having a high affinity with one of the phases is predisposed on the foundation prior to causing the DSA material to phase-separate.

Figure 11A:
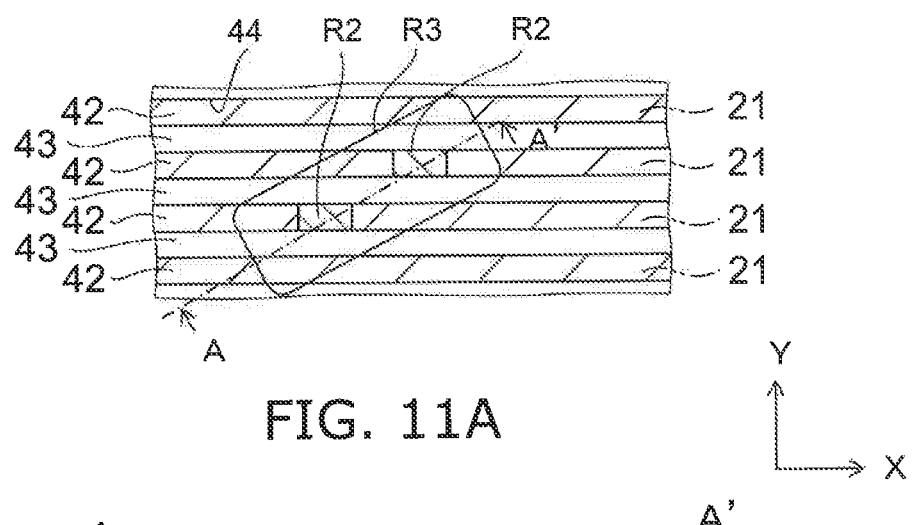
FIG. 11A is a plan view showing an initial structural body used in a seventh embodiment.
Figure 11B:
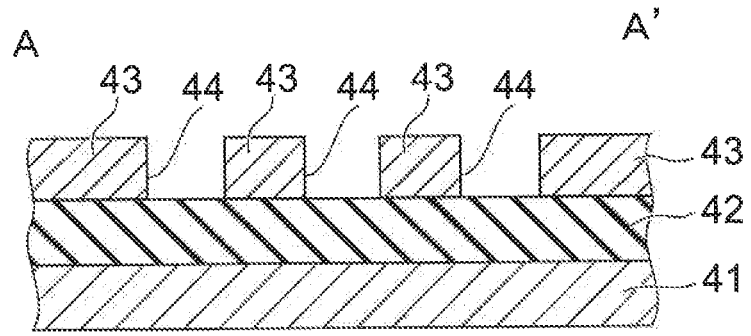
FIG. 11B is a cross-sectional view along line A-A' shown in FIG. 11A.

FIG. 11A is a plan view showing the initial structural body used in the embodiment; and FIG. 11B is a cross-sectional view along line A-A' shown in FIG. 11A.

FIGS. 12A to 12D, FIGS. 13A to 13D, FIGS. 14A to 14D, and FIGS. 15A to 15D are cross-sectional views of processes showing an interconnect formation method for the cutting process according to the embodiment.

The cross sections shown in FIGS. 12A to 12D, FIGS. 13A to 13D, FIGS. 14A to 14D, and FIGS. 15A to 15D correspond to the cross section along line A-A' shown in FIG. 11A.

As shown in FIGS. 11A and 11B, an initial structural body is made in which a silicon oxide film 42 is formed on a silicon substrate 41, and an amorphous silicon (aSi) film 43 is formed on the silicon oxide film 42. Trenches 44 are made in the regions of the aSi film 43 where the interconnects 21 (referring to FIG. 1A) are to be formed.

Then, as shown in FIG. 12A, a DSA material 45a is filled into the trenches 44 and cured. The DSA material 45a is the material of one of the phases formed when a DSA material 45 is phase-separated. In other words, the DSA material 45 phase-separates into the DSA material 45a and a DSA material 45b.

Continuing as shown in FIG. 12B, a hard mask film 46 is formed above the aSi film 43 and the DSA material 45a.

Then, as shown in FIG. 12C, a resist film 47 is formed on the hard mask film 46.

Continuing as shown in FIG. 12D, the resist film 47 is exposed and developed to remove the portion of the resist film 47 positioned in the region R3.

Figure 13A:
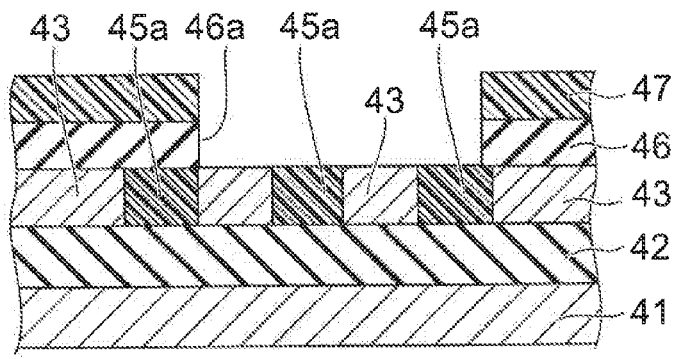

Then, as shown in FIG. 13A, the hard mask film 46 is selectively removed by performing etching using the resist film 47 as a mask. Thereby, an opening 46a is made in the portion of the hard mask film 46 disposed in the region R3. The aSi film 43 and the DSA material 45a are exposed at the bottom surface of the opening 46a.

Figure 13B:
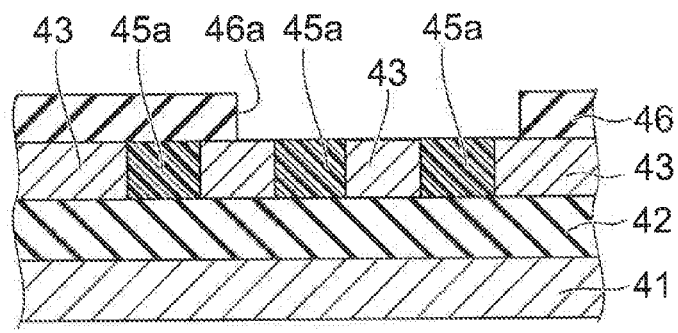

Continuing as shown in FIG. 13B, the resist film 47 is removed.

Figure 13C:
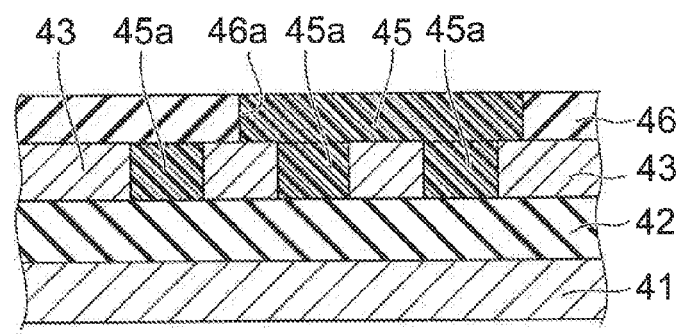

Then, as shown in FIG. 13C, the DSA material 45 is filled into the opening 46a. The DSZ material 45 includes the DSA materials 45a and 45b described above.

Figure 13D:
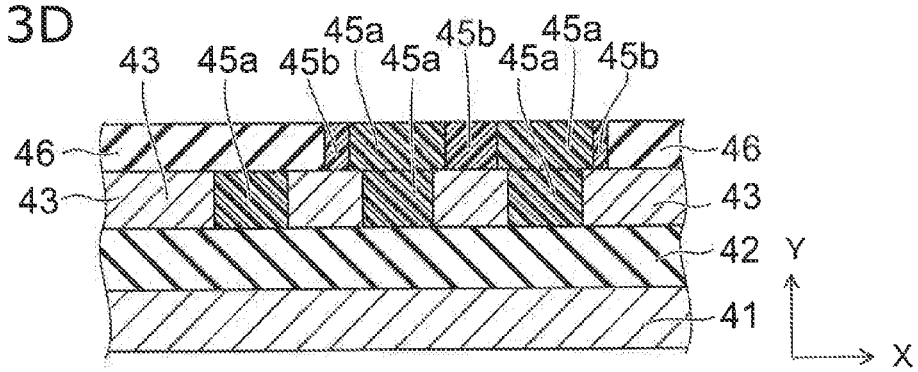

Continuing as shown in FIG. 13D, the DSA material 45 is phase-separated into the DSA material 45a and the DSA material 45b and cured. Thereby, the DSA material 45a and the DSA material 45b are regularly arranged in the opening 46a. At this time, the DSA material 45a that is phase-separated from the DSA material 45 is disposed at a position contacting the DSA material 45a inside the trenches 44 because the DSA material 45a that is phase-separated has high affinity with the DSA material 45a filled into the trenches 44. It is necessary for the DSA material 45a that is phase-separated from the DSA material 45 to be disposed at least in the region directly above the DSA material 45a inside the trenches 44.

Figure 14A:
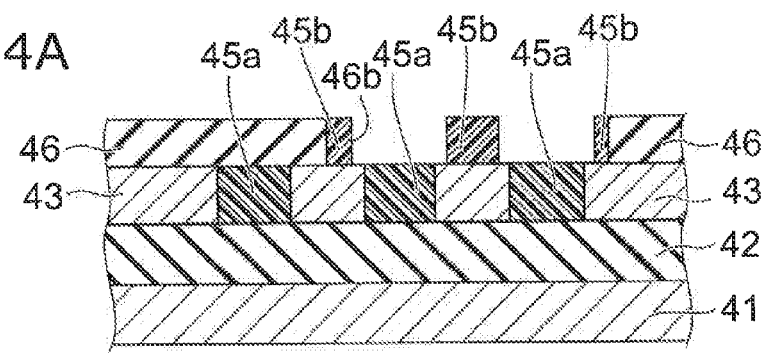

Then, as shown in FIG. 14A, the DSA material 45a disposed inside the opening 46a is removed. Thereby, an opening 46b is made.

Figure 14B:
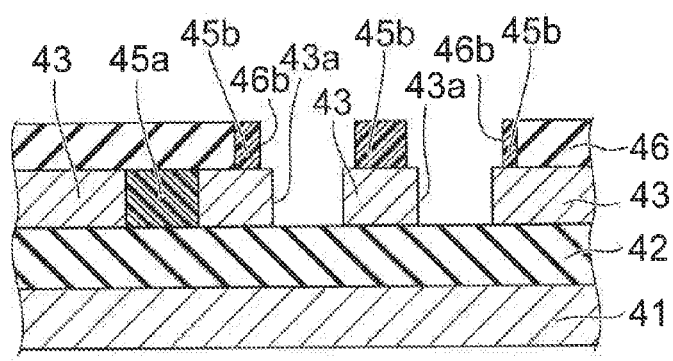

Continuing as shown in FIG. 14B, an opening 43a is made by removing the portions of the DSA material 45a disposed inside the trenches 44 and disposed in the region directly under the opening 46b.

Figure 14C:
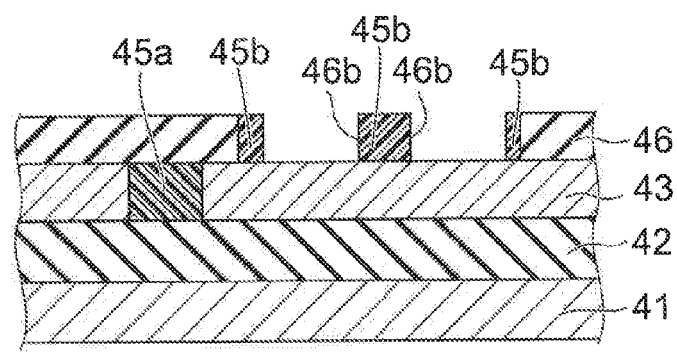

Then, as shown in FIG. 14C, amorphous silicon is re-filled into the opening 43a. The amorphous silicon becomes a portion of the aSi film 43. Thereby, the aSi film 43 is re-formed and the trenches 44 vanish in the regions R2 of the trenches 44 where the interconnects 21 are to be cut.

Figure 14D:
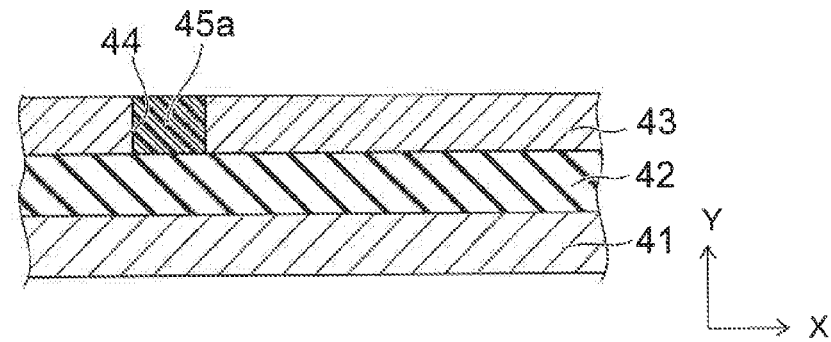

Continuing as shown in FIG. 14D, the hard mask film 46 and the DSA material 45b are removed.

Figure 15A:
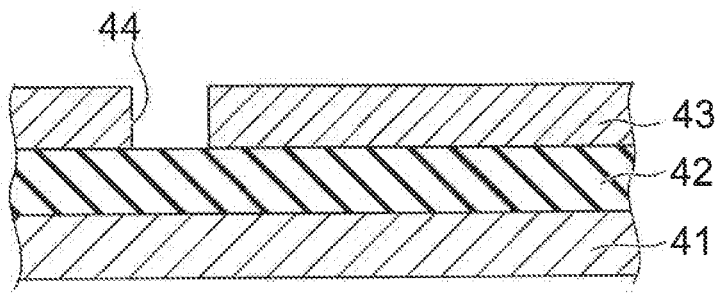

Then, as shown in FIG. 15A, the DSA material 45a (referring to FIG. 14D) filled into the trenches 44 is removed.

Figure 15B:
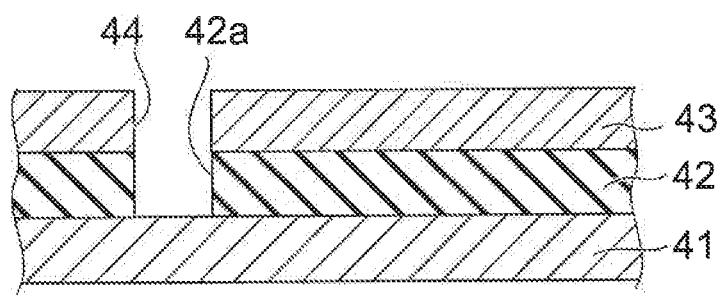

Continuing as shown in FIG. 15B, the portion of the silicon oxide film 42 corresponding to the region directly under the trenches 44 is removed by performing etching using the aSi film 43 as a mask. Thereby, trenches 42a are made in the silicon oxide film 42.

Figure 15C:
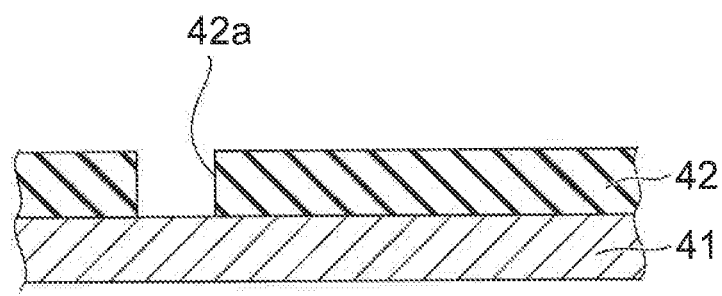

Continuing as shown in FIG. 15C, the aSi film 43 is removed.

Figure 15D:
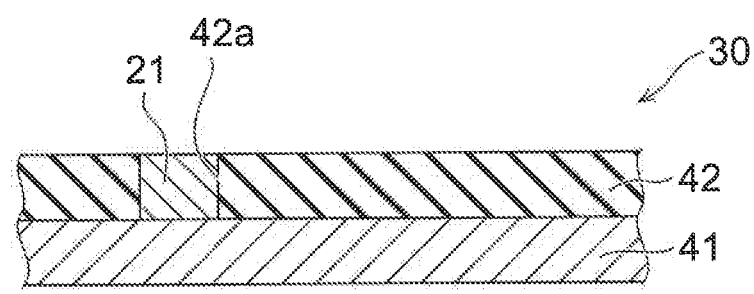

Then, as shown in FIG. 15D, a conductive material is filled into the trenches 42a; and the upper surface of the conductive material is planarized by CMP (Chemical Mechanical Polishing), etc. Thereby, the interconnects 21 are formed inside the trenches 42a. As a result, the intermediate structural body 30 in which the interconnects 21 are cut in the regions R2 is made as shown in FIG. 3E.

According to the embodiment, the DSA material 45a that is phase-separated can easily be disposed in the regions directly above the trenches 44 by utilizing the affinity between the DSA materials 45a when the DSA material 45 is phase-separated inside the opening 46 in the process shown in FIG. 13D because the DSA material 45a is filled into the trenches 44 in the process shown in FIG. 12A. Thereby, the interior of the opening 43a of the aSi film 43 can be reliably re-filled in the process shown in FIG. 14C; and the interconnects 21 that are reliably divided in the regions R2 can be formed in the process shown in FIG. 15D. Otherwise, the configuration, the operations, and the effects of the embodiment are similar to those of the first embodiment described above.

An eighth embodiment will now be described.

The embodiment is an example in which the interconnect formation method for the cutting process of <2> is realized by RIE (Reactive Ion Etching). In the embodiment as well, similarly to the seventh embodiment described above, a material having a high affinity with one of the phases is pre-disposed on the foundation prior to causing the DSA material to phase-separate.

Figure 16A:
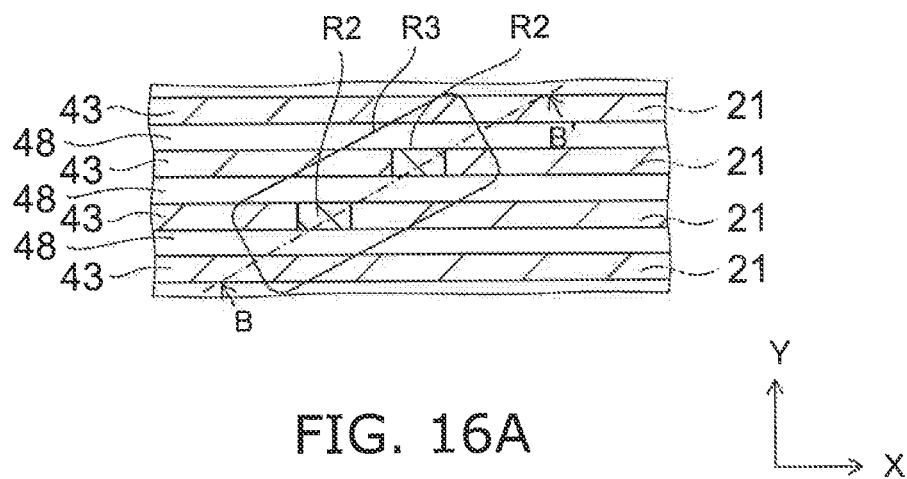
FIG. 16A is a plan view showing an initial structural body used in an eighth embodiment.
Figure 16B:
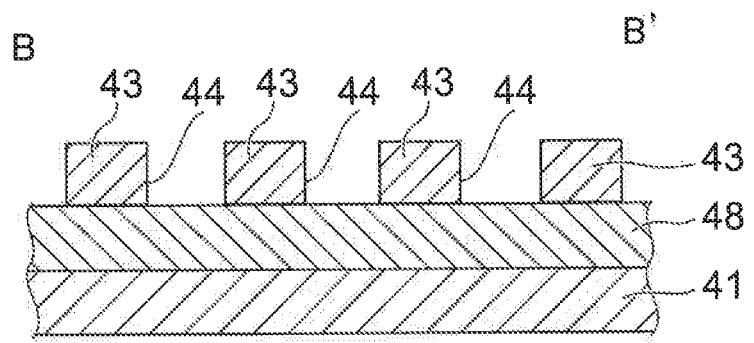
FIG. 16B is a cross-sectional view along line B-B' shown in FIG. 16A.

FIG. 16A is a plan view showing the initial structural body used in the embodiment; and FIG. 16B is a cross-sectional view along line B-B' shown in FIG. 16A.

FIGS. 17A to 17D, FIGS. 18A to 18D, FIGS. 19A to 19D, and FIGS. 20A to 20C are cross-sectional views of processes showing an interconnect formation method for the cutting process according to the embodiment.

The cross sections shown in FIGS. 17A to 17D, FIGS. 18A to 18D, FIGS. 19A to 19D, and FIGS. 20A to 20C correspond to the cross section along line B-B' shown in FIG. 16A.

As shown in FIGS. 16A and 16B, the initial structural body is made in which an interconnect material film 48 is formed on the silicon substrate 41, and the amorphous silicon (aSi) film 43 is formed on the interconnect material film 48. However, unlike the seventh embodiment described above, the aSi film 43 is formed in the regions where the interconnects 21 (referring to FIG. 1A) are to be formed. The regions between the aSi film 43 are the trenches 44. In other words, the recesses and protrusions of the initial structural body used in the embodiment are the reverse of those of the initial structural body (referring to FIGS. 11A and 11B) used in the seventh embodiment described above.

Figure 17A:
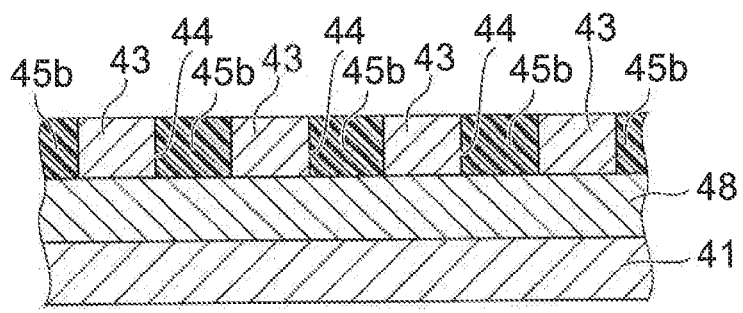
FIGS. 17A to 17D, FIGS. 18A to 18D, FIGS. 19A to 19D, and FIGS. 20A to 20C are cross-sectional views of processes showing an interconnect formation method for a cutting process according to the eighth embodiment.

Then, as shown in FIG. 17A, the DSA material 45b is filled into the trenches 44 and cured.

Figure 17B:
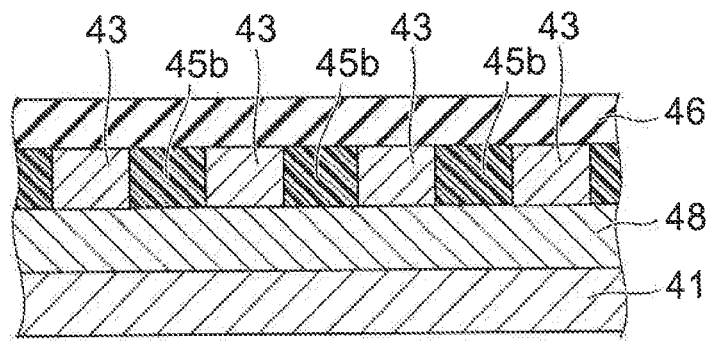

Continuing as shown in FIG. 17B, the hard mask film 46 is formed above the aSi film 43 and the DSA material 45b.

Figure 17C:
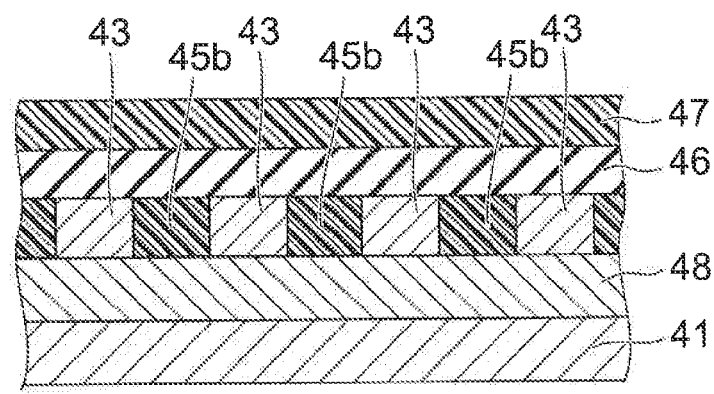

Then, as shown in FIG. 17C, the resist film 47 is formed on the hard mask film 46.

Figure 17D:
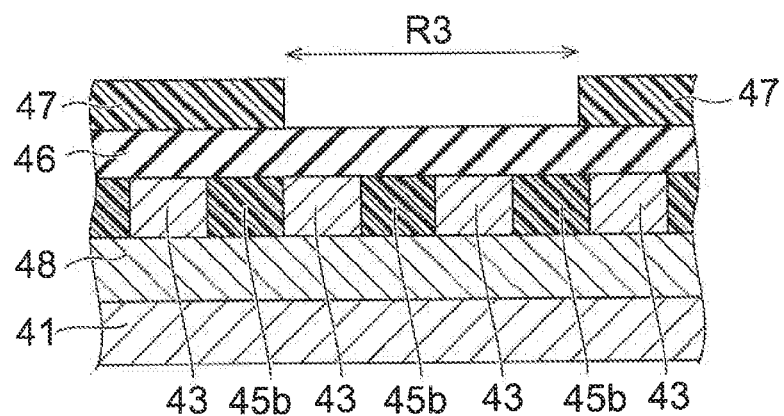

Continuing as shown in FIG. 17D, the resist film 47 is exposed and developed to remove the portion of the resist film 47 positioned in the region R3.

Figure 18A:
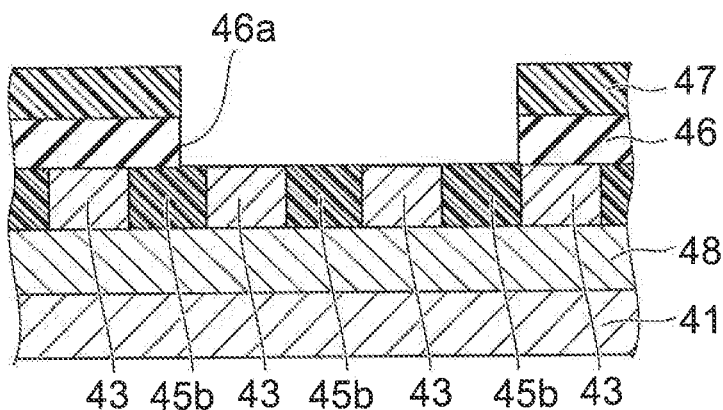

Then, as shown in FIG. 18A, the hard mask film 46 is selectively removed by performing etching using the resist film 47 as a mask. Thereby, the opening 46a is made in the portion of the hard mask film 46 disposed in the region R3. The aSi film 43 and the DSA material 45b are exposed at the bottom surface of the opening 46a.

Figure 18B:
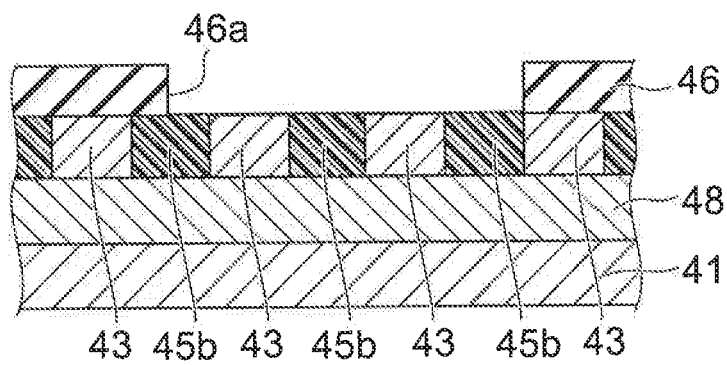

Continuing as shown in FIG. 18B, the resist film 47 is removed.

Figure 18C:
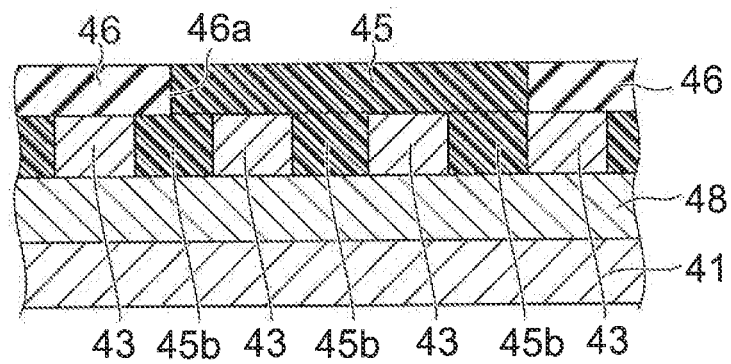

Then, as shown in FIG. 18C, the DSA material 45 is filled into the opening 46a.

Figure 18D:
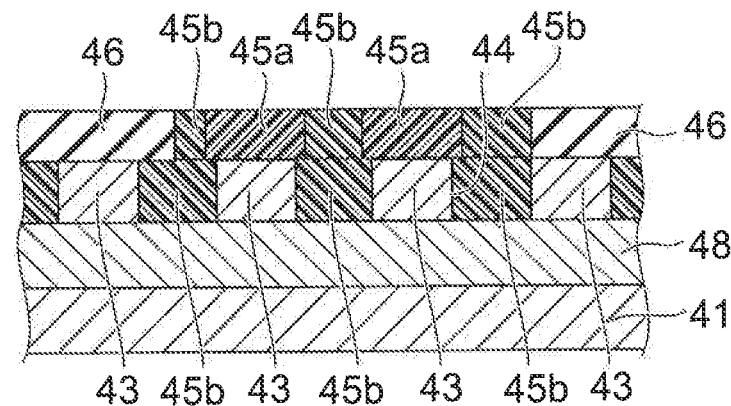

Continuing as shown in FIG. 18D, the DSA material 45 is phase-separated into the DSA material 45a and the DSA material 45b and cured. Thereby, the DSA material 45a and the DSA material 45b are regularly arranged in the opening 46a. At this time, the DSA material 45b that is phase-separated from the DSA material 45 is disposed at a position contacting the DSA material 45b inside the trenches 44 because the DSA material 45b that is phase-separated has high affinity with the DSA material 45b filled into the trenches 44.

Figure 19A:
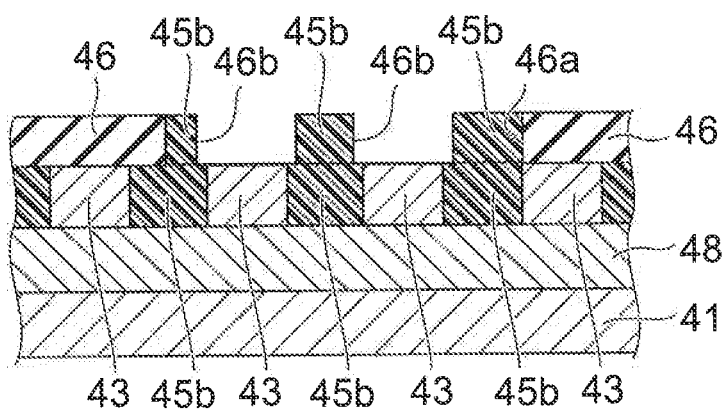

Then, as shown in FIG. 19A, the DSA material 45a disposed inside the opening 46a is removed. Thereby, the opening 46b is made.

Figure 19B:
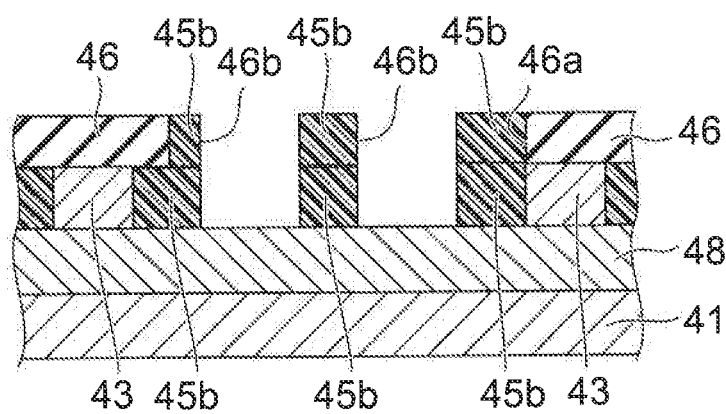

Continuing as shown in FIG. 19B, the opening 43a is made by removing the portion of the aSi film 43 and the DSA material 45b disposed in the region directly under the opening 46b by performing etching using the hard mask film 46 and the DSA material 45b as a mask. Thereby, the aSi film 43 vanishes in the regions where the interconnects 21 are to be cut; and the aSi film 43 remains only in the regions where the interconnects 21 are to be formed. The DSA material 45b that is used as the mask also is removed in this etching process.

Figure 19C:
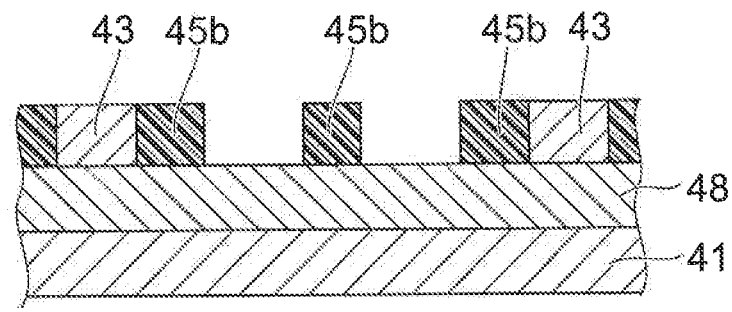

Then, as shown in FIG. 19C, the hard mask film 46 is removed.

Figure 19D:
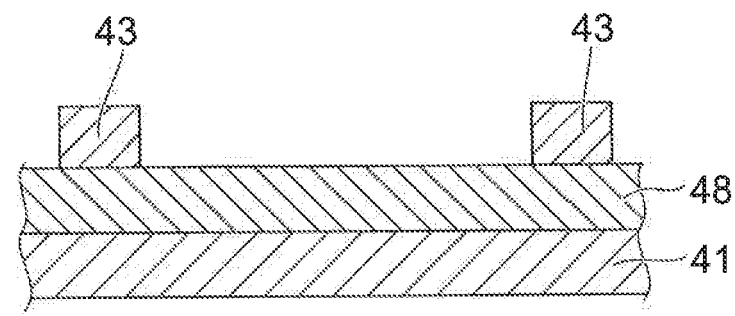

Continuing as shown in FIG. 19D, the DSA material 45b is removed.

Figure 20A:
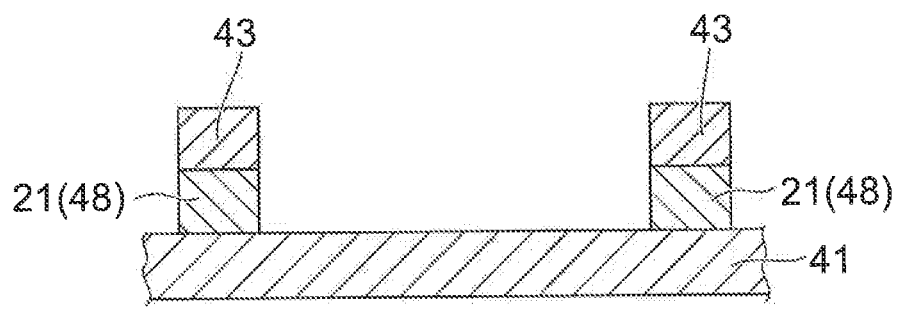

Then, as shown in FIG. 20A, the interconnect material film 42 is etched using the aSi film 43 as a mask. Thereby, the interconnect material film 42 remains in only the regions directly under the aSi film 43 to become the interconnects 21.

Figure 20B:
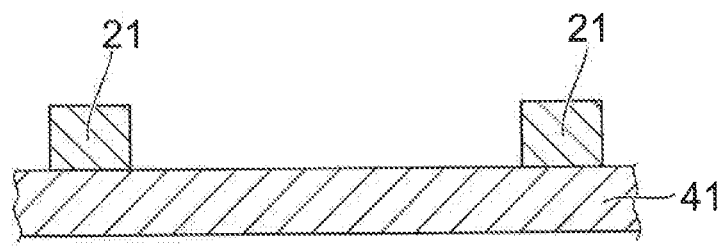

Continuing as shown in FIG. 20B, the aSi film 43 is removed. As a result, the intermediate structural body 30 in which the interconnects 21 are cut in the regions R2 is made as shown in FIG. 3E.

Figure 20C:
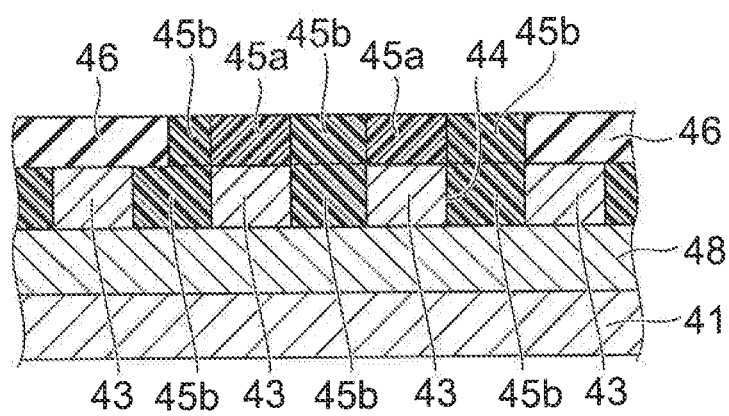

As shown in FIG. 20C, it is necessary for the DSA material 45a that is phase-separated from the DSA material 45 to be disposed at least in the regions directly above the aSi film 43 inside the trenches 44 in the process of phase-separating the DSA material 45 shown in FIG. 18D.

According to the embodiment, the DSA material 45b that is phase-separated can easily be disposed in the regions directly above the trenches 44 by utilizing the affinity between the DSA materials 45b when the DSA material 45 is phase-separated inside the opening 46 in the process shown in FIG. 18D because the DSA material 45b is filled into the trenches 44 in the process shown in FIG. 17A. Thereby, the Si film 43 disposed in the region directly under the opening 46b can be reliably removed in the process shown in FIG. 19B; and the interconnects 21 that are reliably divided in the regions R2 can be formed in the process shown in FIG. 20B. Otherwise, the configuration, the operations, and the effects of the embodiment are similar to those of the first embodiment described above.

A ninth embodiment will now be described.

The embodiment is a modification of the process of setting the region V6 (referring to FIG. 4E) formed by elongating the region V4 (referring to FIG. 4D) to include the regions V5 (referring to FIG. 4D) on the two Y-direction sides of the region V4 in the mask data generation method for the connecting process of <3> described above. In the embodiment, the size of the region V6 is set by considering the alignment shift and the patterning conversion difference in the patterning.

FIG. 21 shows the method for setting the region V2 of the embodiment.

In the embodiment as well, the elongated amount when setting the region V6 can be determined by elongating the region V4 in the Y direction by an approach that is similar to that of the second embodiment described above. As a result, it is favorable for the elongated amount for one side of the region V4 to be not less than u+2Zy and not more than U+2Zy+v. It is favorable for the elongated amount in the X direction to be 2Zx. Thus, according to the embodiment, the interconnects 21 can be connected reliably and the effects on the adjacent interconnects 21 can be avoided by determining the elongated amount of the region V6 based on the patterning conversion difference amount of the guide mask film and the alignment shift amount assumed for the guide mask film. Otherwise, the configuration, the operations, and the effects of the embodiment are similar to those of the first embodiment described above.

A tenth embodiment will now be described.

The embodiment is an example in which the interconnect formation method for the connecting process of <4> is realized by a damascene process. In the embodiment, a material having a high affinity with one of the phases is pre-disposed on the foundation prior to causing the DSA material to phase-separate.

Figure 22A:
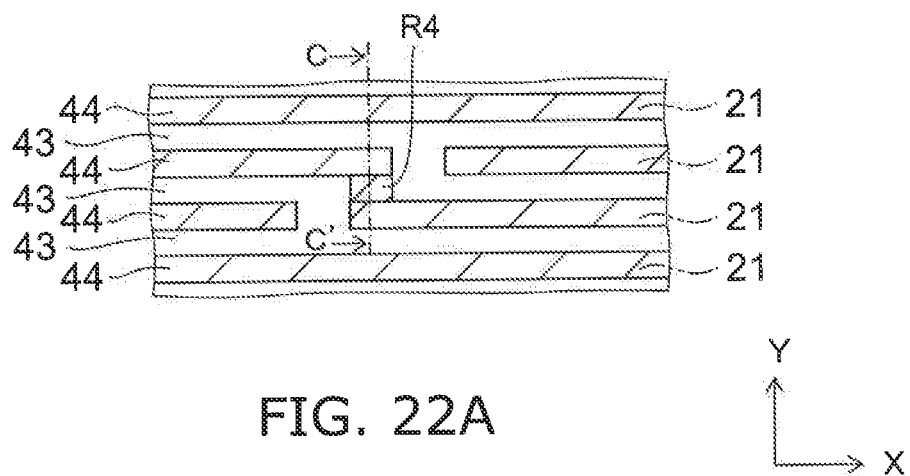
FIG. 22A is a plan view showing an initial structural body used in a tenth embodiment.
Figure 22B:
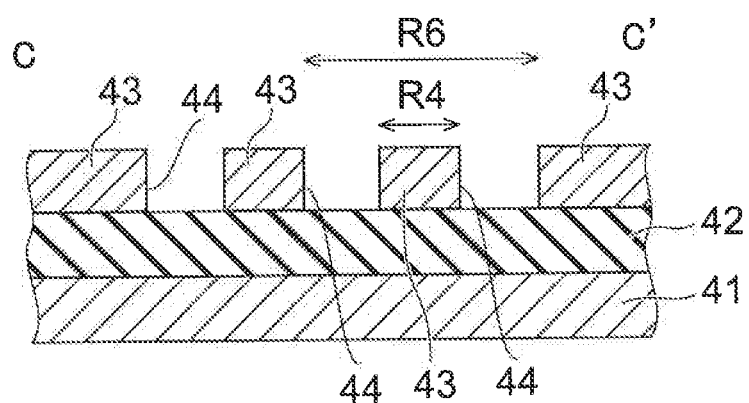
FIG. 22B is a cross-sectional view along line C-C' shown in FIG. 22A.

FIG. 22A is a plan view showing the initial structural body used in the embodiment; and FIG. 22B is a cross-sectional view along line C-C' shown in FIG. 22A.

FIGS. 23A to 23D, FIGS. 24A to 24D, FIGS. 25A to 25D, and FIGS. 26A to 26D are cross-sectional views of processes showing an interconnect formation method for the connecting process according to the embodiment.

The cross sections shown in FIGS. 23A to 23D, FIGS. 24A to 24D, FIGS. 25A to 25D, and FIGS. 26A to 26D correspond to the cross section along line C-C' shown in FIG. 22A.

As shown in FIGS. 22A and 22B, an intermediate structural body is made in which the silicon oxide film 42 is formed on the silicon substrate 41, and the amorphous silicon (aSi) film 43 is formed on the silicon oxide film 42. The trenches 44 are made in the regions of the aSi film 43 where the interconnects 21 (referring to FIG. 1A) are to be formed.

Figure 23A:
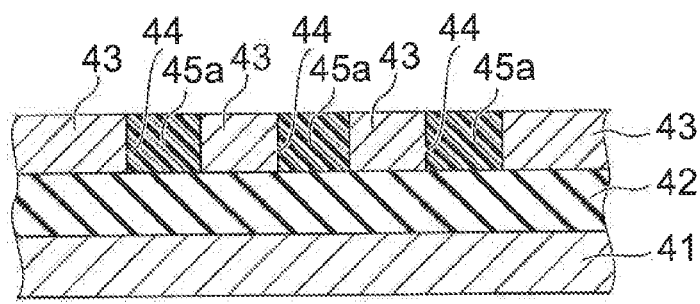
FIGS. 23A to 23D, FIGS. 24A to 24D, FIGS. 25A to 25D, and FIGS. 26A to 26D are cross-sectional views of processes showing an interconnect formation method for a connecting process according to the tenth embodiment.

Then, as shown in FIG. 23A, the DSA material 45a is filled into the trenches 44 and cured.

Figure 23B:
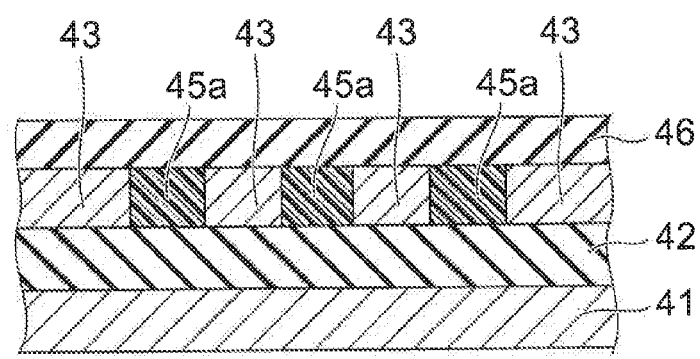

Continuing as shown in FIG. 23B, the hard mask film 46 is formed above the aSi film 43 and the DSA material 45a.

Figure 23C:
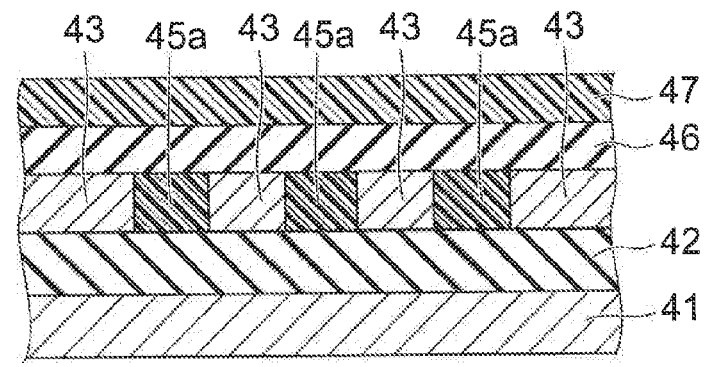

Then, as shown in FIG. 23C, the resist film 47 is formed on the hard mask film 46.

Figure 23D:
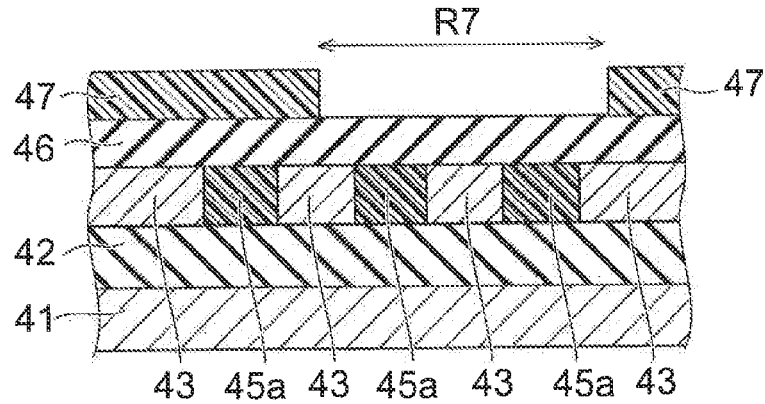

Continuing as shown in FIG. 23D, the resist film 47 is exposed and developed to remove the portion of the resist film 47 positioned in the region R7.

Figure 24A:
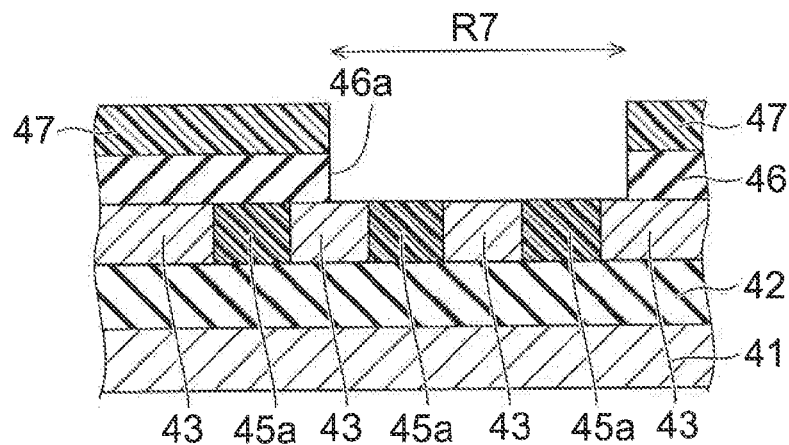

Then, as shown in FIG. 24A, the hard mask film 46 is selectively removed by performing etching using the resist film 47 as a mask. Thereby, the opening 46a is made in the portion of the hard mask film 46 disposed in the region R7. The aSi film 43 and the DSA material 45a are exposed at the bottom surface of the opening 46a.

Figure 24B:
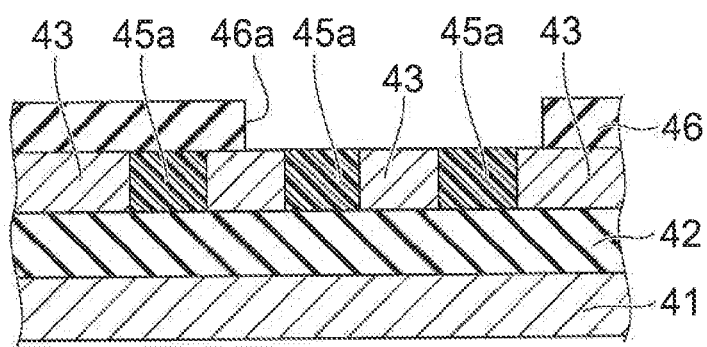

Continuing as shown in FIG. 24B, the resist film 47 is removed.

Figure 24C:
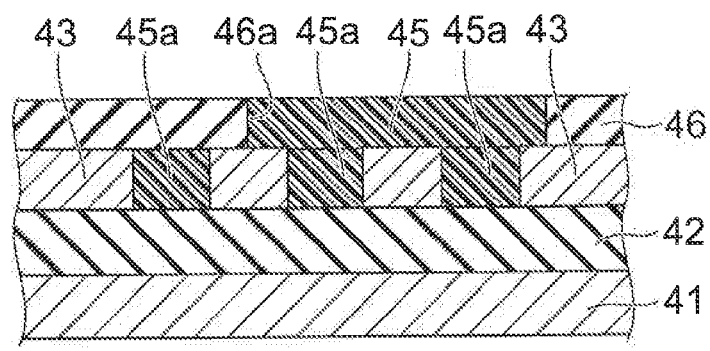

Then, as shown in FIG. 24C, the DSA material 45 is filled into the opening 46a. The DSZ material 45 includes the DSA materials 45a and 45b described above.

Figure 24D:
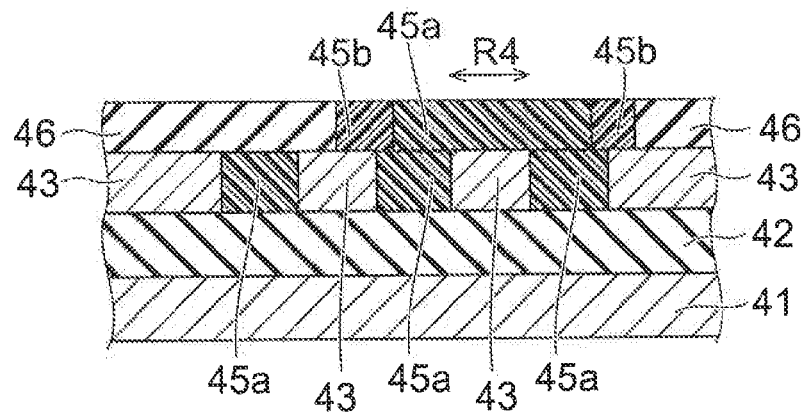

Then, as shown in FIG. 24D, the DSA material 45 is phase-separated into the DSA material 45a and the DSA material 45b and cured. Thereby, the DSA material 45a and the DSA material 45b are regularly arranged in the opening 46a. At this time, the DSA material 45a that is phase-separated from the DSA material 45 is disposed at a position contacting the DSA material 45a inside the trenches 44 because the DSA material 45a that is phase-separated has high affinity with the DSA material 45a filled into the trenches 44. The DSA material 45a that is phase-separated from the DSA material 45 is disposed in the region R6. It is necessary for the DSA material 45a that is phase-separated from the DSA material 45 to be disposed to contact at least the DSA material 45a filled into the two trenches 44 provided on two sides of the region R4 where the connection is to be made.

Figure 25A:
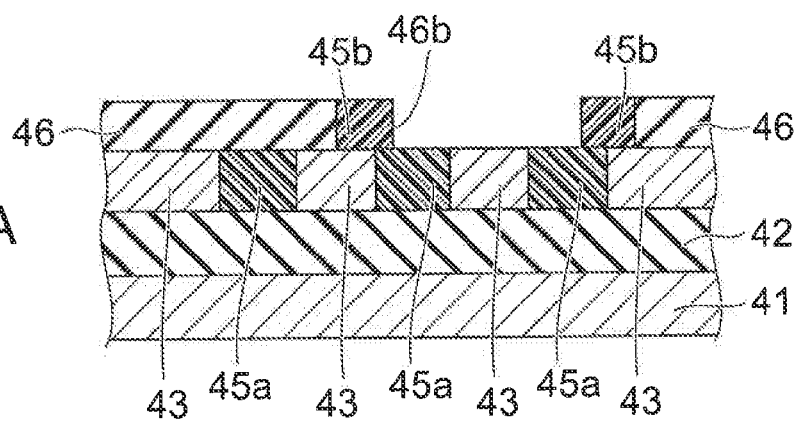

Then, as shown in FIG. 25A, the DSA material 45a disposed inside the opening 46a is removed. Thereby, the opening 46b is made.

Figure 25B:
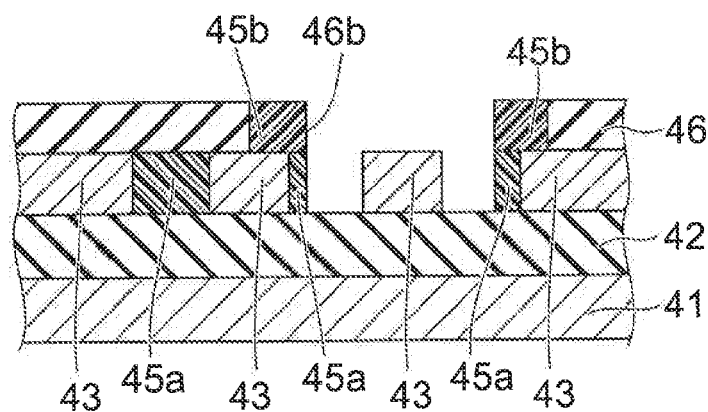

Continuing as shown in FIG. 25B, the portions of the DSA material 45a disposed inside the trenches 44 that are disposed in the region directly under the opening 46b are removed.

Figure 25C:
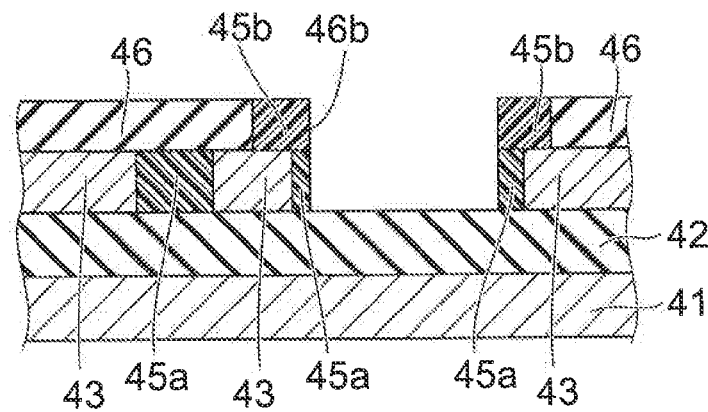

Then, as shown in FIG. 25C, the aSi film 43 positioned in the region directly under the opening 46b is removed by performing etching using the hard mask film 46 and the DSA material 45b as a mask. Thereby, the aSi film 43 in the region R4 where the interconnects 21 are to be connected to each other is removed.

Figure 25D:
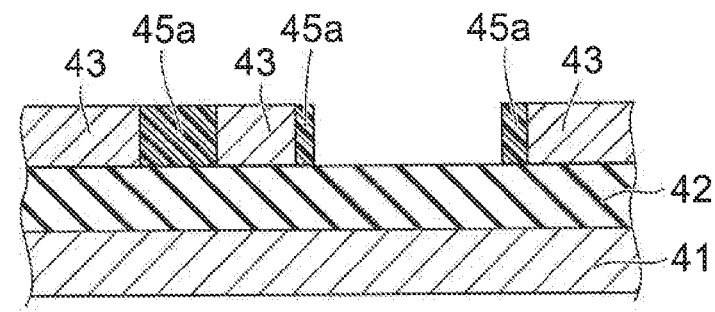

Continuing as shown in FIG. 25D, the hard mask film 46 and the DSA material 45b are removed.

Figure 26A:
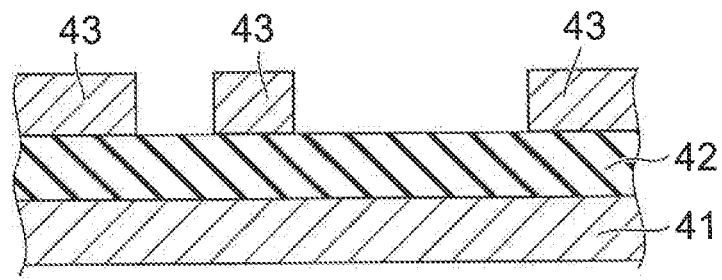

Then, as shown in FIG. 26A, the DSA material 45a is removed.

Figure 26B:
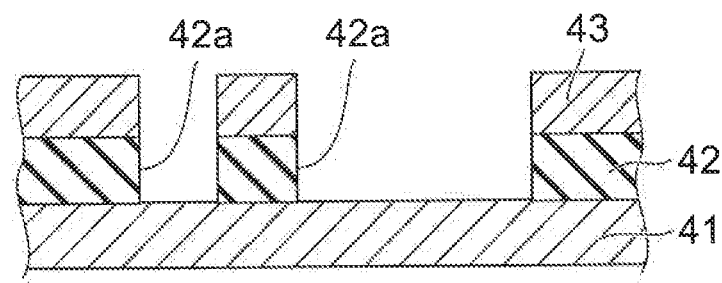

Continuing as shown in FIG. 26B, the silicon oxide film 42 is patterned by performing etching using the aSi film 43 as a mask. Thereby, the trenches 42a are made in the silicon oxide film 42.

Figure 26C:
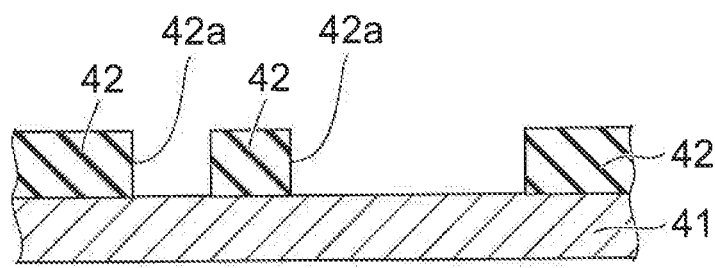

Then, as shown in FIG. 26C, the aSi film 43 is removed.

Figure 26D:
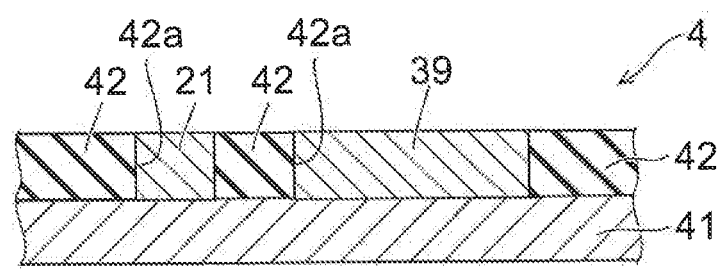

Continuing as shown in FIG. 26D, a conductive material is filled into the trenches 42a; and the upper surface of the conductive material is planarized by CMP, etc. The interconnects 21 and the conductive member 39 are formed inside the trenches 42a. The conductive member 39 is disposed in the region R6. As a result, the integrated circuit device 40 in which the interconnects 21 are connected to each other by the conductive member 39 is manufactured as shown in FIG. 5E.

According to the embodiment, the DSA material 45a that is phase-separated can be caused to reliably contact the DSA material 45a filled into the trenches 44 by utilizing the affinity between the DSA materials 45a when the DSA material 45 inside the opening 46a is phase-separated in the process shown in FIG. 24D by filling the DSA material 45a into the trenches 44 in the process shown in FIG. 23A. Thereby, the interconnects 21 can be reliably connected to each other when the conductive member 39 is formed in the process shown in FIG. 26D. Otherwise, the configuration, the operations, and the effects of the embodiment are similar to those of the first embodiment described above.

An eleventh embodiment will now be described.

The embodiment is an example in which the interconnect formation method for the cutting process of <4> is realized by RIE. In the embodiment as well, similarly to the tenth embodiment described above, a material having a high affinity with one of the phases is pre-disposed on the foundation prior to causing the DSA material to phase-separate.

Figure 27A:
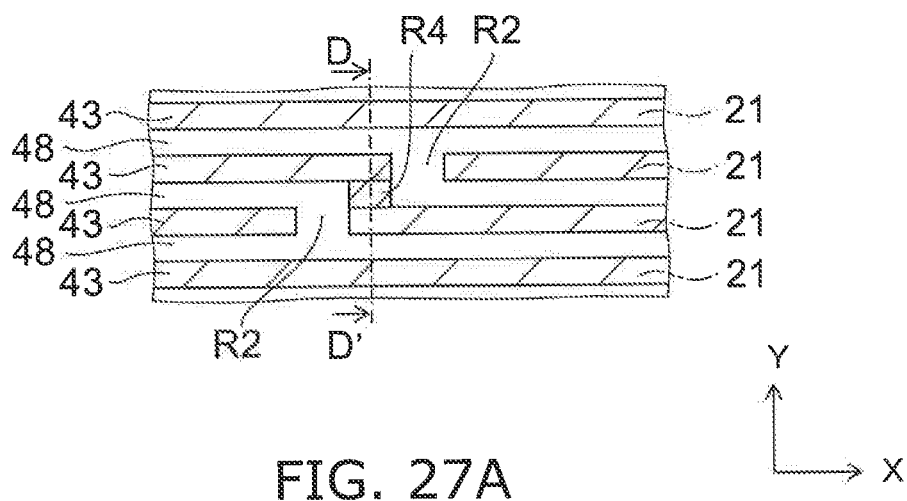
FIG. 27A is a plan view showing an initial structural body used in an eleventh embodiment.
Figure 27B:
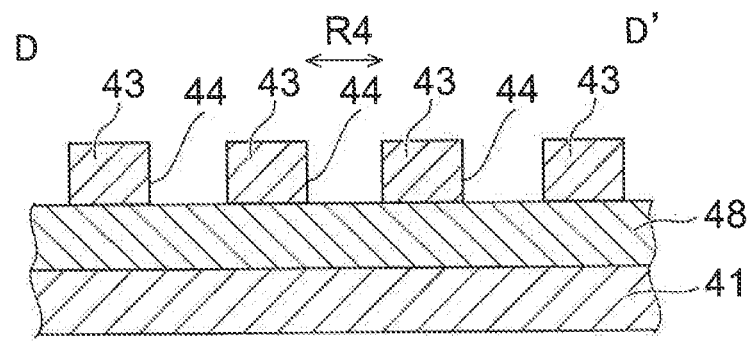
FIG. 27B is a cross-sectional view along line D-D' shown in FIG. 27A.

FIG. 27A is a plan view showing the initial structural body used in the embodiment; and FIG. 27B is a cross-sectional view along line D-D' shown in FIG. 27A.

FIGS. 28A to 28D, FIGS. 29A to 29D, FIGS. 30A to 30D, and FIGS. 31A to 31C are cross-sectional views of processes showing an interconnect formation method for the cutting process according to the embodiment.

The cross sections shown in FIGS. 28A to 28D, FIGS. 29A to 29D, FIGS. 30A to 30D, and FIGS. 31A to 31C correspond to the cross section along line D-D' shown in FIG. 27A.

As shown in FIGS. 27A and 27B, an intermediate structural body is made in which the interconnect material film 48 is formed on the silicon substrate 41, and the amorphous silicon (aSi) film 43 is formed on the interconnect material film 48. However, unlike the tenth embodiment described above, the aSi film 43 is formed in the regions where the interconnects 21 (referring to FIG. 1A) are to be formed. The regions between the aSi films 43 are the trenches 44. In other words, the recesses and protrusions of the intermediate structural body used in the embodiment are the reverse of those of the intermediate structural body (referring to FIGS. 22A and 22B) used in the tenth embodiment described above.

Figure 28A:
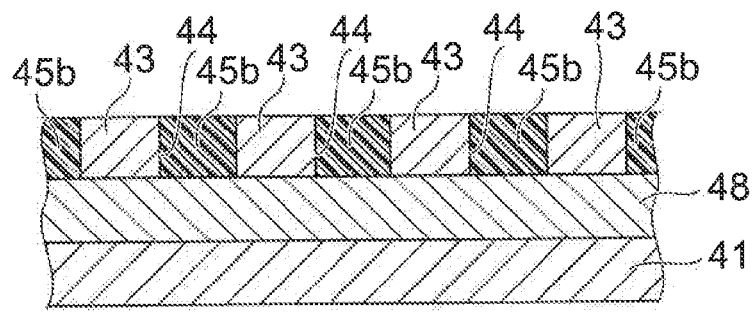
FIGS. 28A to 28D, FIGS. 29A to 29D, FIGS. 30A to 30D, and FIGS. 31A to 31C are cross-sectional views of processes showing an interconnect formation method for a cutting process according to the eleventh embodiment.

First, as shown in FIG. 28A, the DSA material 45b is filled into the trenches 44 and cured.

Figure 28B:
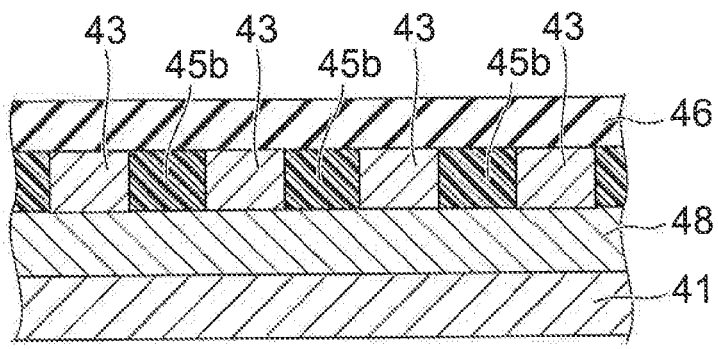

Continuing as shown in FIG. 28B, the hard mask film 46 is formed above the aSi film 43 and the DSA material 45b.

Figure 28C:
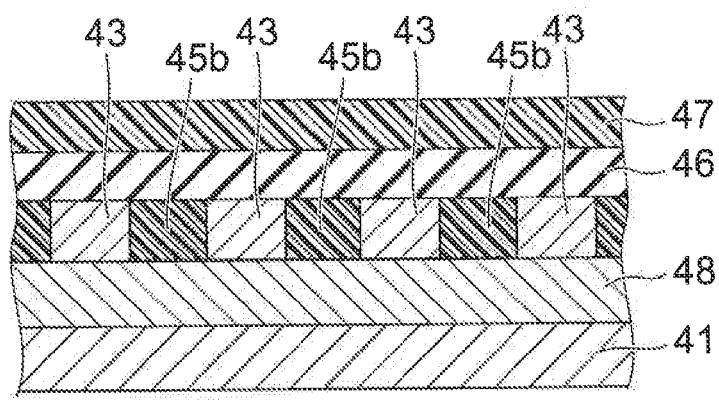

Then, as shown in FIG. 28C, the resist film 47 is formed on the hard mask film 46.

Figure 28D:
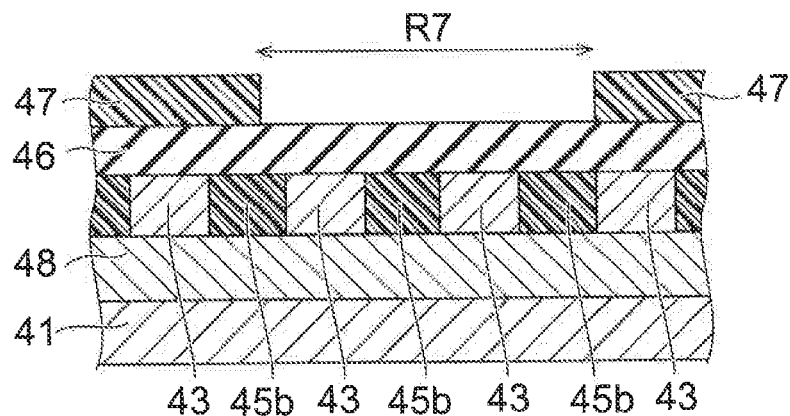

Continuing as shown in FIG. 28D, the resist film 47 is exposed and developed to remove the portion of the resist film 47 positioned in the region R7.

Figure 29A:
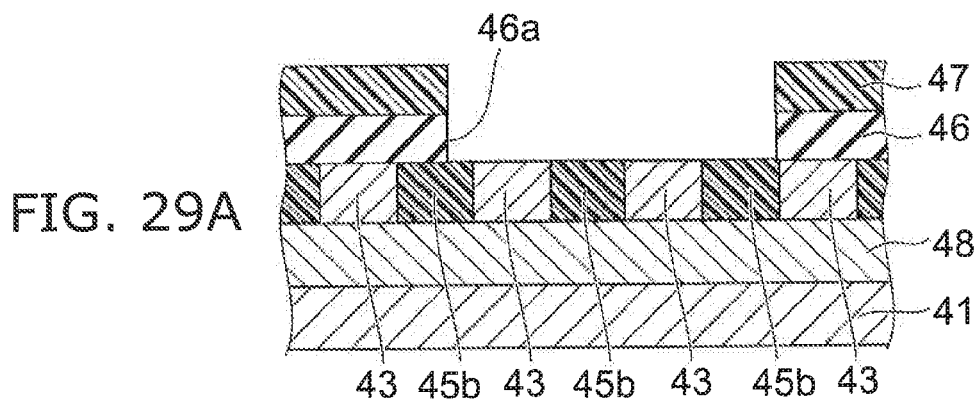

Then, as shown in FIG. 29A, the hard mask film 46 is selectively removed by performing etching using the resist film 47 as a mask. Thereby, the opening 46a is made in the portion of the hard mask film 46 disposed in the region R7. The aSi film 43 and the DSA material 45b are exposed at the bottom surface of the opening 46a.

Figure 29B:
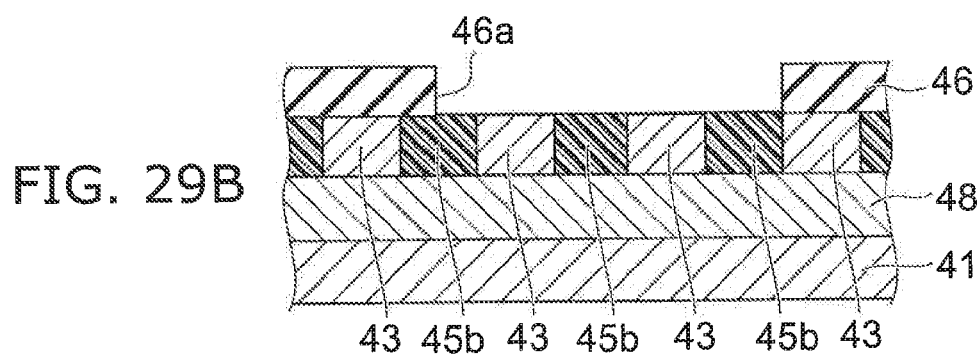

Continuing as shown in FIG. 29B, the resist film 47 is removed.

Figure 29C:
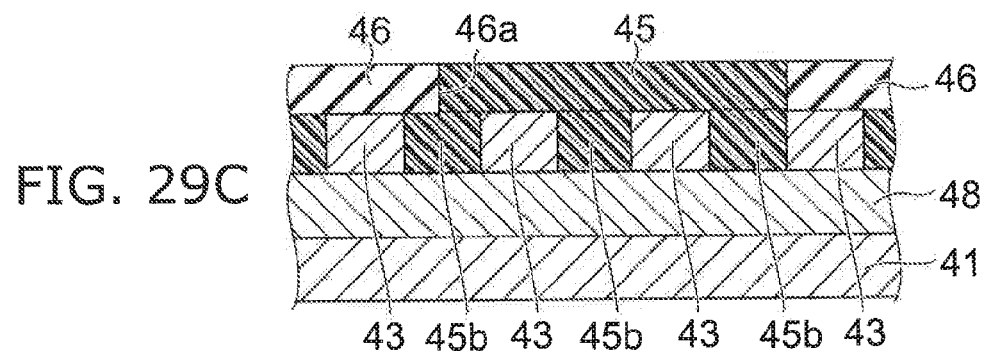

Then, as shown in FIG. 29C, the DSA material 45 is filled into the opening 46a.

Figure 29D:
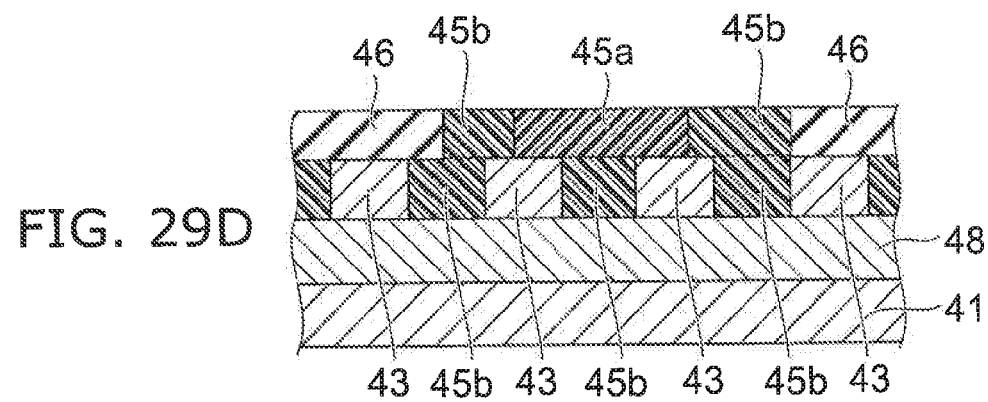

Continuing as shown in FIG. 29D, the DSA material 45 is phase-separated into the DSA material 45a and the DSA material 45b and cured. Thereby, the DSA material 45a and the DSA material 45b are regularly arranged in the opening 46a. At this time, the DSA material 45b that is phase-separated from the DSA material 45 is disposed at a position contacting the DSA material 45b inside the trenches 44 and is disposed in the region R6 because the DSA material 45b that is phase-separated has high affinity with the DSA material 45b filled into the trenches 44.

Figure 30A:
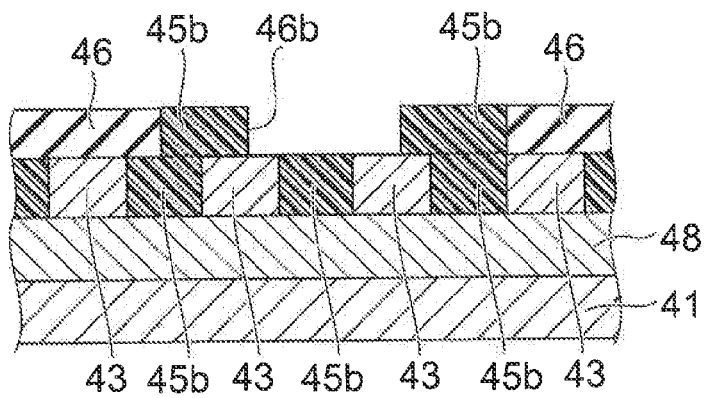

Then, as shown in FIG. 30A, the DSA material 45a disposed inside the opening 46a is removed. Thereby, the opening 46b is made.

Figure 30B:
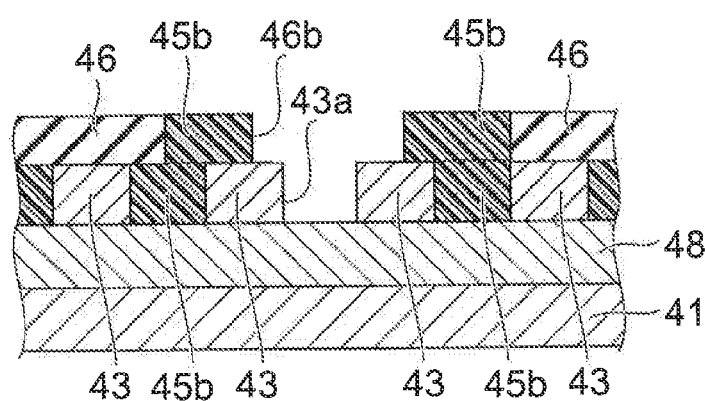

Continuing as shown in FIG. 30B, the DSA material 45b that is disposed inside the trenches 44 and positioned in the region directly under the opening 46b is removed. Thereby, the opening 43a is made.

Figure 30C:
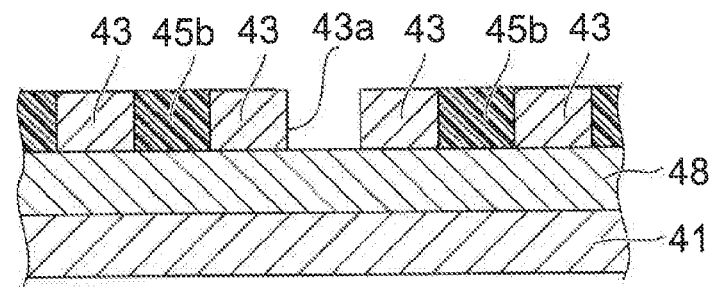

Then, as shown in FIG. 30C, the DSA material 45b disposed inside the hard mask film 46 and the opening 46a is removed.

Figure 30D:
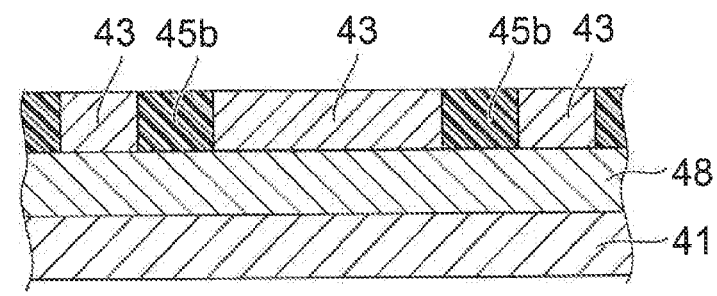

Continuing as shown in FIG. 30D, amorphous silicon is re-filled into the opening 43a. The amorphous silicon becomes a portion of the aSi film 43. Thereby, the aSi film 43 is disposed not only in the regions where the interconnects 21 (referring to FIG. 5E) are to be formed but also in the region where the conductive member 39 (referring to FIG. 5E) is to be formed.

Figure 31A:
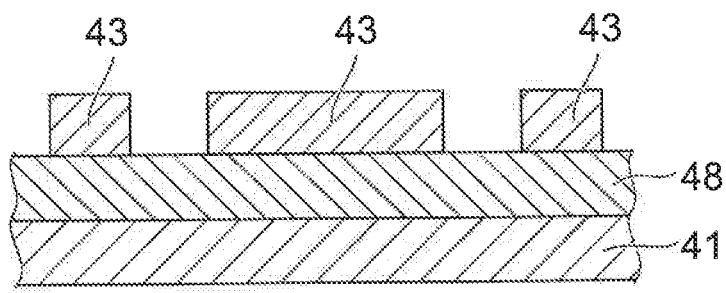
Figure 31B:
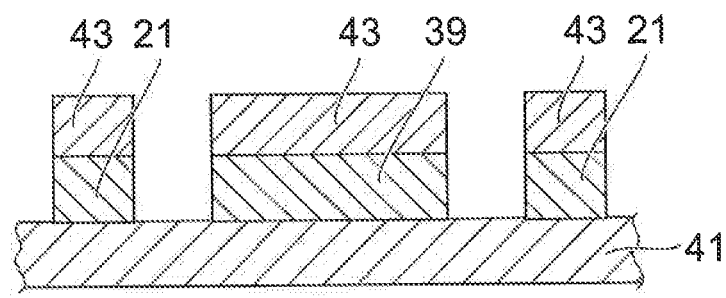

Then, as shown in FIG. 31A, the DSA material 45b is removed. Continuing as shown in FIG. 31B, the interconnect material film 42 is etched using the aSi film 43 as a mask. Thereby, the interconnect material film 42 remains in only the regions directly under the aSi film 43 to become the interconnects 21 and the conductive member 39.

Figure 31C:
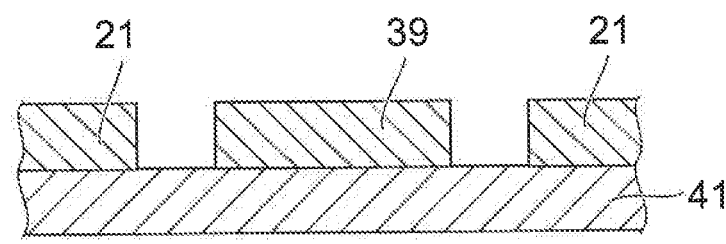
Figure 33A:
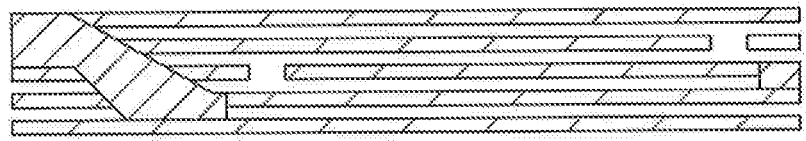
Figure 33B:
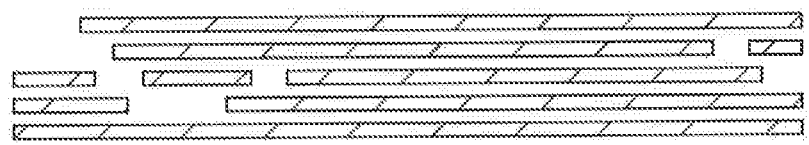
Figure 33C:
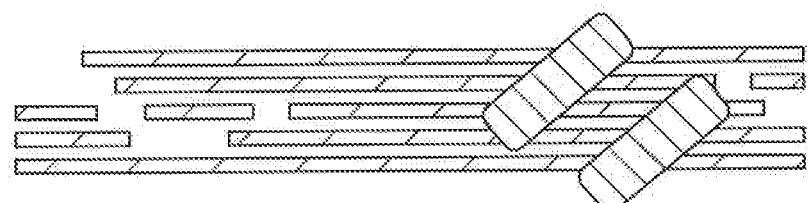
Figure 33D:
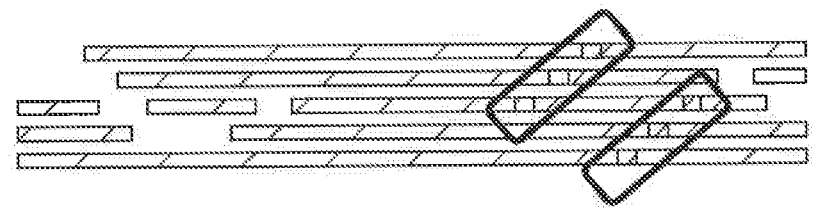
Figure 33E:
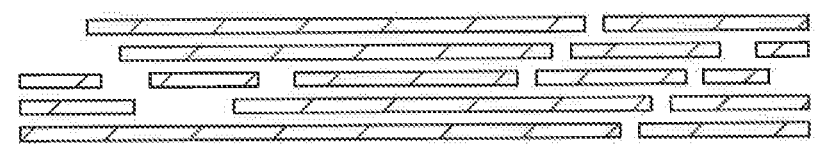
Figure 34A:
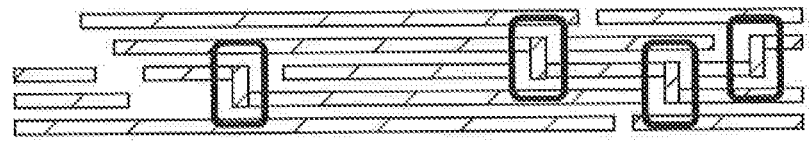
Figure 34B:
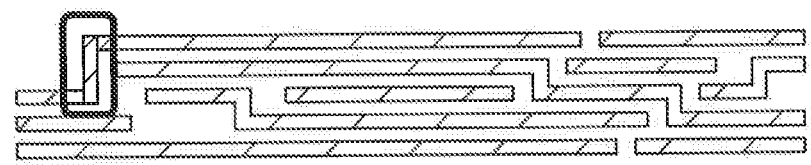
Figure 34C:
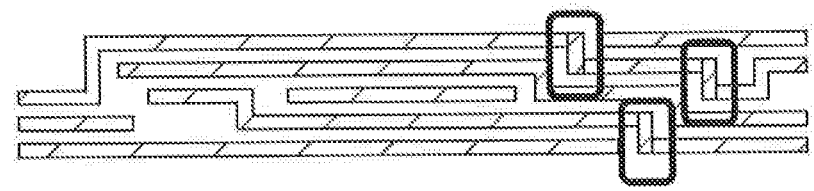
Figure 34D:
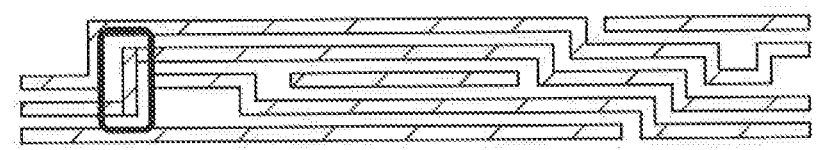

Continuing as shown in FIG. 31C, the aSi film 43 is removed. As a result, the integrated circuit device 40 in which the interconnects 21 are connected by the conductive member 39 is manufactured as shown in FIG. 5E.

According to the embodiment, the DSA material 45a that is phase-separated can be disposed at the desired position by utilizing the affinity between the DSA materials 45b when the DSA material 45 is phase-separated inside the opening 46a in the process shown in FIG. 29D by filling the DSA material 45a into the trenches 44 in the process shown in FIG. 28A. Thereby, the interconnects 21 can be reliably connected to each other when the conductive member 39 is formed in the process shown in FIG. 31B. Otherwise, the configuration, the operations, and the effects of the embodiment are similar to those of the first embodiment described above.

A twelfth embodiment will now be described.

FIGS. 32A to 32E, FIGS. 33A to 33E, and FIGS. 34A to 34D show a method for manufacturing the integrated circuit device according to the embodiment.

According to the embodiment, a circuit pattern having a configuration that is more complex can be made by combining a patterning process by lithography with the cutting process and connecting process using DSA described above.

Otherwise, the configuration, the operations, and the effects of the embodiment are similar to those of the first embodiment described above.

A thirteenth embodiment will now be described.

FIGS. 35A to 35C and FIGS. 36A and 36B show a cutting process of the embodiment.

FIGS. 37A to 37C and FIGS. 38A to 38C show a connecting process of the embodiment.

Figure 35A:
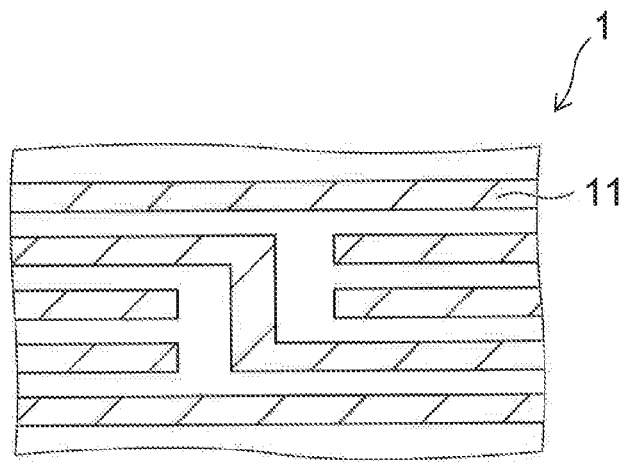
Figure 35B:
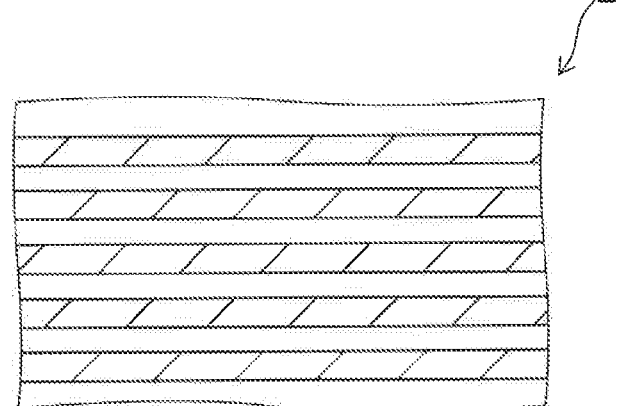

In the embodiment, the circuit pattern 1 shown in FIG. 35A is made from the initial pattern 2 shown in FIG. 35B.

Figure 35C:
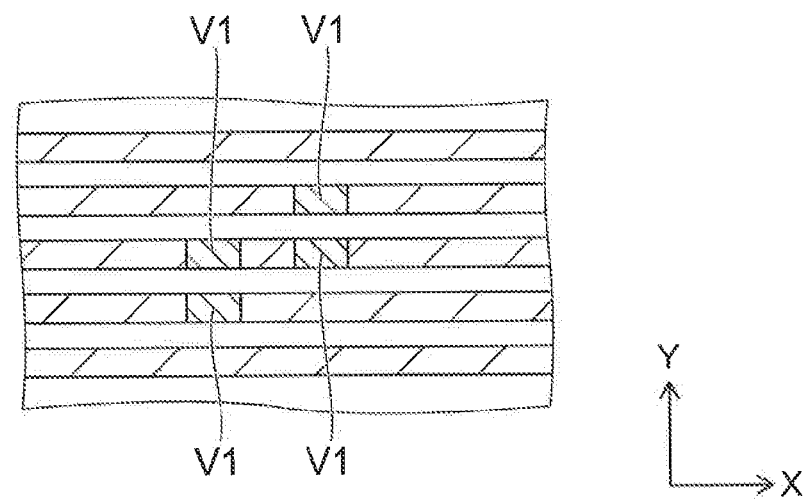

First, as shown in FIG. 35C, the regions V1 existing in the initial pattern 2 and not existing in the circuit pattern 1 are extracted. The regions V1 correspond to the portions of the actual interconnects 21 corresponding to the interconnect patterns 11 to be removed. The regions V1 can be obtained by performing, for example, the Boolean operation of {(initial pattern 2) NOT (circuit pattern 1)}.

Then, as shown in FIGS. 36A and 36B, the interconnects 21 are cut by locally removing the interconnects 21.

Figure 37A:
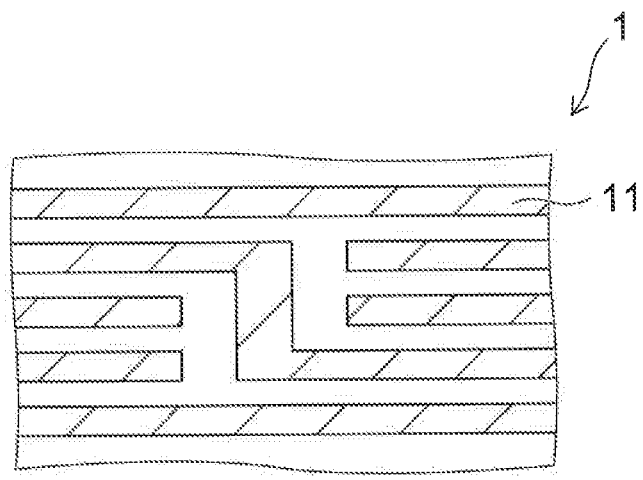
Figure 37B:
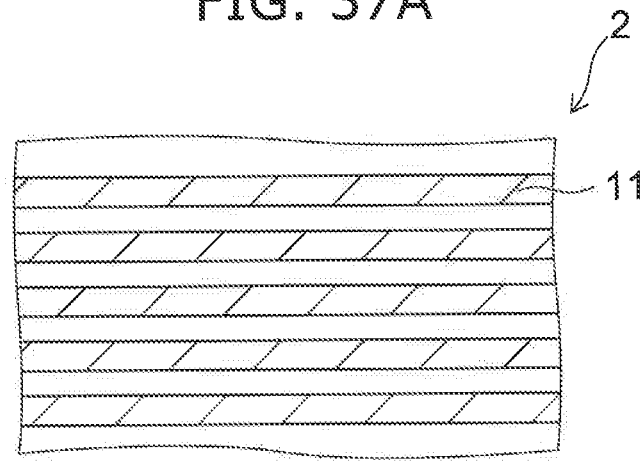
Figure 37C:
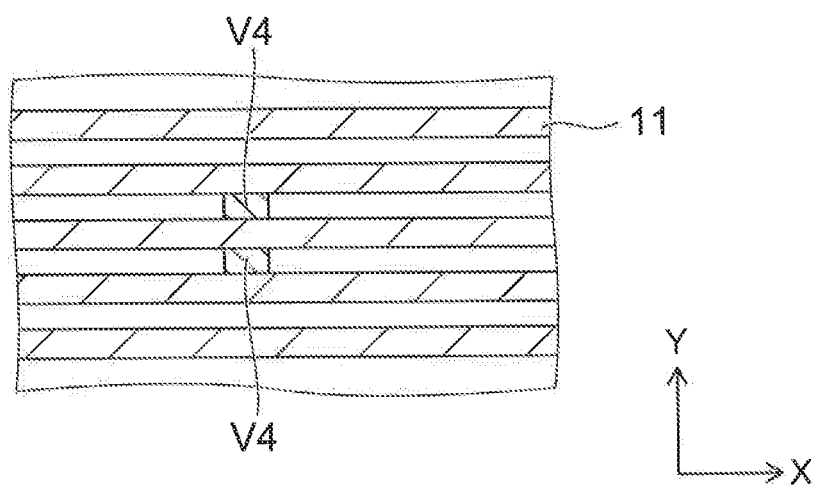
Figure 39E:
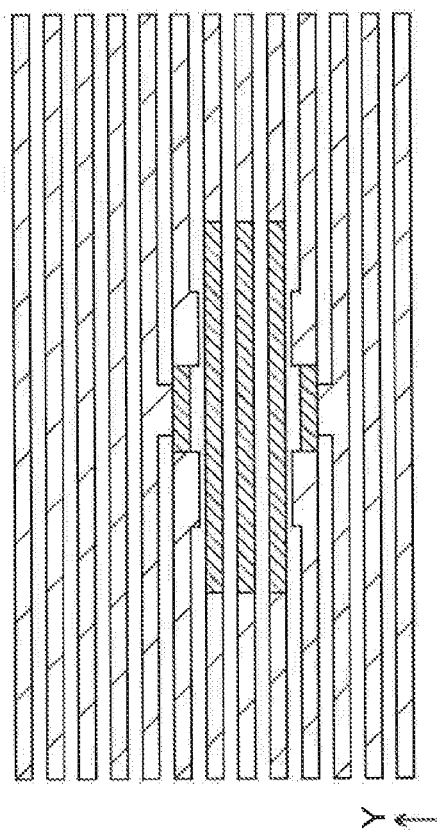
Figure 39F:
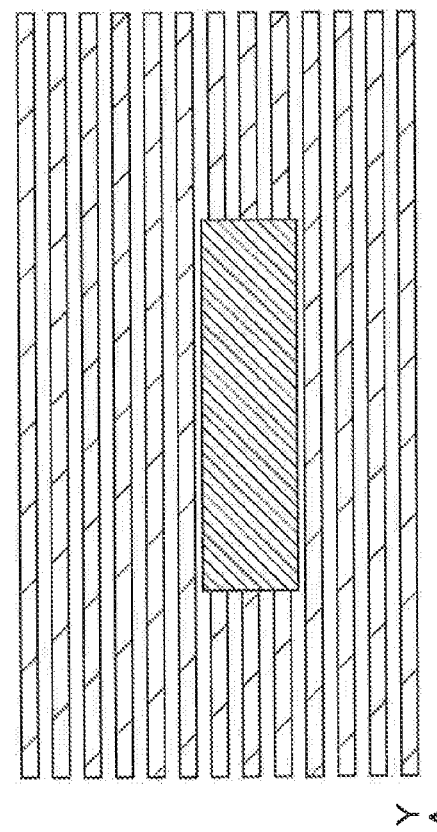
Figure 39G:
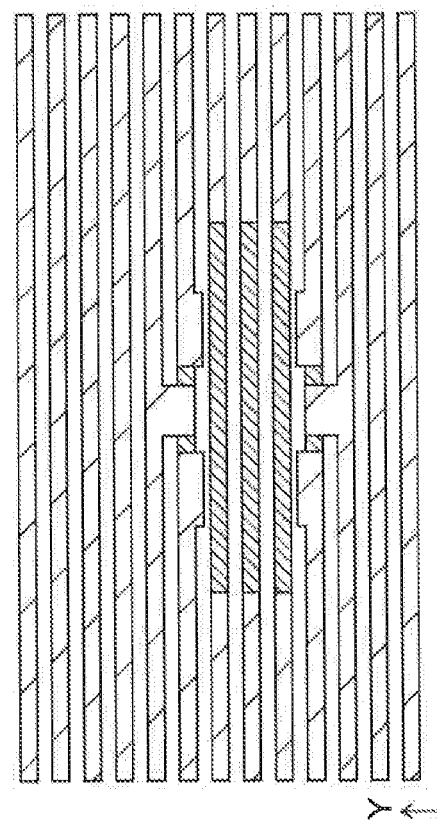
Figure 39H:
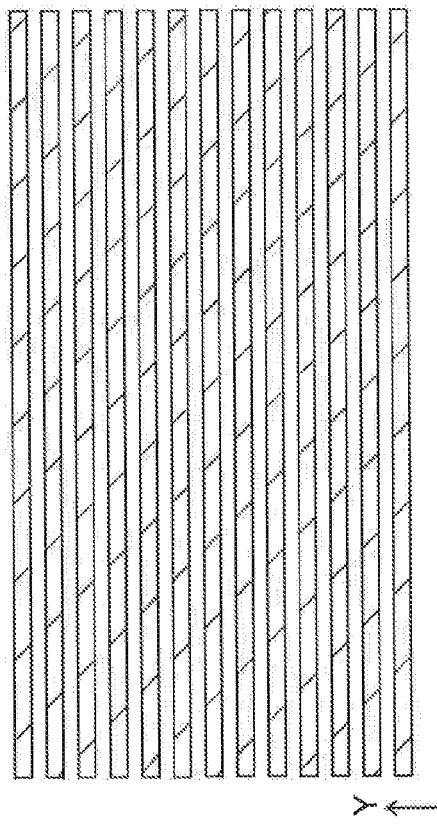

As shown in FIG. 37C, the regions V4 existing in the circuit pattern 1 and not existing in the initial pattern 2 are extracted. The regions V4 correspond to the portions between the actual interconnects 21 (referring to FIG. 1A) corresponding to the interconnect patterns 11 to be connected. The regions V4 can be obtained by performing, for example, the Boolean operation of {(circuit pattern 1) NOT (initial pattern 2)}.

Then, the interconnects 21 can be connected to each other by performing the processing shown in FIGS. 38A to 38C.

Otherwise, the configuration, the operations, and the effects of the embodiment are similar to those of the first embodiment described above.

A fourteenth embodiment will now be described.

FIG. 39A to FIG. 39K show a method for manufacturing the integrated circuit device according to the embodiment.

According to the embodiment, a circuit pattern including a pad can be made by combining a patterning process by lithography with the cutting process and the connecting process using DSA described above.

Otherwise, the configuration, the operations, and the effects of the embodiment are similar to those of the first embodiment described above.

A fifteenth embodiment will now be described.

FIG. 40A to FIG. 40G show a method for manufacturing the integrated circuit device according to the embodiment.

According to the embodiment, a circuit pattern having a configuration that is more complex can be made by combining a patterning process by lithography with the cutting process and the connecting process using DSA described above.

Otherwise, the configuration, the operations, and the effects of the embodiment are similar to those of the first embodiment described above.

According to the embodiments described above, a method for generating mask data and a method for manufacturing an integrated circuit device for making an integrated circuit using DSA can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A method for generating a mask configured to form a circuit pattern on a substrate using a directed self-assembly material, comprising:

extracting a first region not existing in the circuit pattern and existing in an initial pattern, the initial pattern including a plurality of interconnect patterns extending in a first direction;

setting at least one second region formed by elongating the first region in a second direction intersecting the first direction to straddle the first region in the second direction;

setting a third region to include at least one of the second regions, the directed self-assembly material being disposed in the third region;

generating mask data to include the third region; and making a mask based on the mask data.

2. The method according to claim 1, wherein a length of the second region in the second direction is determined based on a length of the first region in the second direction, a patterning conversion difference amount of a guide mask film, and an alignment shift amount assumed for the guide mask film.

3. The method according to claim 1, wherein the second region includes two of the first regions and a region between the two of the first regions.

4. A method for manufacturing an integrated circuit device, comprising:

making an opening in a region of a guide mask film corresponding to a third region by patterning the guide mask film using a mask made based on mask data configured to form a circuit pattern on a substrate using a directed self-assembly material, the mask data being generated by extracting a first region not existing in the circuit pattern and existing in an initial pattern, the initial pattern including a plurality of interconnect patterns extending in a first direction, setting at least one second region formed by elongating the first region in a second direction intersecting the first direction to straddle the first region in the second direction, and setting the third region to include at least one of the second regions;

disposing the directed self-assembly material inside the opening;

phase-separating the directed self-assembly material into a first block made of a first phase and a second block made of a second phase to dispose the second block in a region corresponding to the second region;

removing the second block; and performing processing using the guide mask film and the first block as a mask.

5. The method according to claim 4, wherein the mask data is generated by determining a length of the second region in the second direction based on a length of the first region in the second direction, a patterning conversion difference amount of the guide mask film, and an alignment shift amount assumed for the guide mask film.

6. The method according to claim 4, wherein the mask data is generated by the second region being a region including two of the first regions and a region between the two of the first regions.

7. The method according to claim 4, further comprising selectively disposing a member under the guide mask film, the member having affinity with the first phase or the second phase.

8. A method for generating a mask configured to form a circuit pattern on a substrate using a directed self-assembly material, comprising:

extracting a first region existing in the circuit pattern and not existing in an initial pattern, the initial pattern including a plurality of interconnect patterns extending in a first direction;

extracting at least one second region, the second region being a portion of the interconnect pattern contacting the first region and positioned in a second direction intersecting the first direction as viewed from the first region;

setting at least one third region formed by elongating the first region to include all of the second regions contacting the first region;

setting a fourth region to include at least one of the third regions, the directed self-assembly material being disposed in the fourth region;

generating mask data to include the fourth region; and making a mask based on the mask data.

9. The method according to claim 8, wherein the setting of the third region includes determining an amount of the elongating based on a patterning conversion difference amount of a guide mask film and an alignment shift amount assumed for the guide mask film.

10. A method for manufacturing an integrated circuit device, comprising:

making an opening in a region of a guide mask film corresponding to a fourth region by patterning the guide mask film using a mask made based on mask data configured to form a circuit pattern on a substrate using a directed self-assembly material, the mask data being generated by extracting a first region existing in the circuit pattern and not existing in an initial pattern, the initial pattern including a plurality of interconnect patterns extending in a first direction, extracting at least one second region, the second region being a portion of the interconnect pattern contacting the first region and positioned in a second direction intersecting the first direction as viewed from the first region, setting at least one third region formed by elongating the first region to include all of the second regions contacting the first region, and setting the fourth region to include at least one of the third regions;

disposing the directed self-assembly material inside the opening;

phase-separating the directed self-assembly material into a first block made of a first phase and a second block made of a second phase to dispose the second block in a region corresponding to the third region;

removing the second block; and performing processing using the guide mask film and the first block as a mask.

11. The method according to claim 10, wherein the mask data is generated by determining an amount of the elongating when setting the third region based on a patterning conversion difference amount of the guide mask film and an alignment shift amount assumed for the guide mask film.

12. The method according to claim 10, further comprising selectively disposing a member under the guide mask film, the member having affinity with the first phase or the second phase.

* * * * *